ns

STACKED-TYPE PIEZOELECTRIC DEVICE AND METHOD FOR MANUFACTURING THE SAME

This application claims the benefit of Taiwan application Serial No. 98123514, filed Jul. 10, 2009, the subject matter of which is incorporated herein by reference.

BACKGROUND

1. Technical Field

The disclosure relates in general to a stacked-type piezoelectric device and a method for manufacturing the same, and more particularly to a stacked-type piezoelectric device capable of reducing damage and the volume and a method for manufacturing the same.

2. Description of the Related Art

Piezoelectric material has an asymmetric center in the crystal phase, which results in uneven charge distribution. After polarization treatment, the inputted voltage is converted into mechanical displacement or deformation which generates electric current. When the inputted voltage is alternative current, the material vibrates correspondingly and generates vibration waves. On the contrary, when the piezoelectric membrane is pressed which generates deformation potential energy, the potential energy is converted into electric energy at the moment of release.

Due to the special characteristics of the material, the piezoelectric material is suitable for being applied to many devices in people's daily lives, for energy saving and environmental protection. For example, when the piezoelectric device is applied to the lens of a compact electronic product, such as the lens of a camera phone, a constant voltage can be applied to the piezoelectric device under the lens for causing constant expansion, which drives the lens to perform the focus adjustment. When the piezoelectric device is applied to an ultrasonic nebulizer, the piezoelectric ceramic membrane generates high-frequency vibration waves, which break up water into extremely fine mist droplets and sends the mist droplets to the air through the high-frequency vibration principle of the piezoelectric effect. Furthermore, through the piezoelectric effect, the deformed piezoelectric material is able to generate electric current. For example, the piezoelectric device is placed in the shock absorbent material in the automobile engine. When the engine vibrates, the piezoelectric device is deformed which generates electric current. As a result, part of the energy is recycled to save energy. Other examples include consumer products and industrial supplies, such as the ink droplet control in the inkjet printer, ultrasonic medical image, nondestructive testing for detecting the internal defects within the structure . . . etc. However, most of the piezoelectric devices are made of several sheets of stacked piezoelectric materials for higher driving deformation or greater electric current. The reasons include: (1) the deformation of the piezoelectric materials is nonlinear, so it is easier to control the deformation when the piezoelectric materials are stacked together; and (2) less driving current is needed, which obtains better frequency response.

Please refer to FIG. 1. FIG. 1 illustrates a stacked-type piezoelectric actuator. Several vertically-stacked piezoelectric layers 2 are electrically connected to each other and electrically conducted through two lateral sides. When a low voltage is applied for driving the device, those piezoelectric layers 2 are deformed. As a result, the entire height of the piezo stack increases to (L+ΔL) from the original stacking height L.

Conventionally, when the stacked-type piezoelectric device is in use, a conductive surrounding structure or a frame which functions as a casing is required to fasten the piezoelectric materials. Please refer to FIG. 2, which illustrates the structure of a conventional piezoelectric actuator. The piezoelectric actuator includes several vertically-stacked piezoelectric layers 2, an electrode layers 3 disposed between the piezoelectric layers 2, a frame 4 to fasten the piezoelectric layers 2 and a contact layer 5 to conduct electricity to the electrode layers 3. The frame 4 is connected to the lateral sides of the piezoelectric layers 2 and electrically connected to an external connector 6 through a copper wire 7. As shown in FIG. 2, an operating voltage is applied to the connector 6, and the right half and the left half of the frame 4 are connected to the positive and negative electrodes respectively. As a result, the even-numbered and odd-numbered layers of the electrode layers 3 which are counted from the top carry positive and negative charge respectively. An electric field is generated correspondingly in the center region M where electrode layers 3 overlap. Accordingly, the piezoelectric layers 2 corresponding to the center region M deform and expand. The expanding direction is indicated by the arrows. The portion of the piezoelectric layers 2 corresponding to the edge region R expands less because there is no electric field effect there. Lateral ends of the piezoelectric layers 2 do not deform because being restrained by the frame 4.

However, the conventional piezoelectric actuator has some disadvantages when in practical use. The lateral ends of the piezoelectric layers 2 are fastened by the frame 4. When the central portion of the piezoelectric layers 2 deform, the total height of the lateral sides remains the same. Therefore, tensile stress exists at the boundary between the central portion and the rim of the piezoelectric layers 2, which causes extremely uneven stress distribution. When the deformation is greater, the tensile stress becomes higher, which leads to fracture easily. Furthermore, only part of the piezoelectric layers 2 which corresponds to the center region M is deformed effectively. In the edge region R where the electrodes do not overlap cannot effectively perform piezoelectric effect. Moreover, the frame 4 used for fastening the stacked piezoelectric layers 2 increases the entire volume of the piezoelectric actuator, and the piezoelectric actuator becomes heavier accordingly.

SUMMARY

According to the present disclosure, a stacked-type piezoelectric device is provided. The device includes several piezoelectric layers, several conductive layers, the first and second contact holes and several insulating portions. The piezoelectric layers are disposed between the conductive layers. The first and second contact holes respectively penetrate the piezoelectric layers and the conductive layers. A conductive material is filled in the first and second contact holes. The insulating portions are formed in the conductive layer correspondingly. Two adjacent insulating portions are respectively formed at the outer rims of the first and second contact holes, to electrically isolate the conductive layer in which the insulating portions are formed from the conductive material in the contact hole.

According to the present disclosure, a multi-layer stacked-type piezoelectric device is provided. The device includes several piezoelectric units stacked together. Each piezoelectric unit includes a piezoelectric layer, the first and second conductive layers, the first and second contact holes, and the first and second insulating portions. The piezoelectric layer has an upper surface and a lower surface. The first and second conductive layers are respectively formed on the upper and lower surfaces of the piezoelectric layer. The first and second contact holes respectively penetrate two lateral sides of the piezoelectric layer, and each of the contact holes is filled with a conductive material. The first and second insulating portions are respectively formed in the first and second conductive layers on the upper and lower surfaces of the piezoelectric layer. Also, the first and second insulating portions are respectively formed at the outer rims of the first and second contact holes, for electrically isolating the conductive layer in which the insulating portions are formed from the conductive material in the contact hole. In an embodiment, the first and second contact holes respectively penetrate two lateral sides of the first conductive layer, the piezoelectric layer and the second conductive layer. Furthermore, in the multi-layer stacked-type piezoelectric device, one of the first and second insulating portions of each piezoelectric unit corresponds to and contacts one of the first and second insulating portions of an adjacent piezoelectric unit.

According to the present disclosure, a method for manufacturing a multi-layer stacked-type piezoelectric device is provided. First, several piezoelectric units are formed. Each piezoelectric unit includes a piezoelectric layer having an upper surface and a lower surface, the first and second conductive layers respectively formed on the upper and lower surfaces of the piezoelectric layer, the first and second contact holes respectively penetrating two lateral sides of the first conductive layer, the piezoelectric layer and the second conductive layer, and the first and second insulating portions respectively formed in the first and second conductive layers on the upper and lower surfaces of the piezoelectric layer. Also, the first and second insulating portions are respectively formed at the outer rims of the first and second contact holes. Next, the piezoelectric units are stacked, so that one of the first and second insulating portions of each piezoelectric unit contacts one of the first and second insulating portions of an adjacent piezoelectric unit. After stacked, the first and second contact holes form the first and second channel. Then, conductive material is filled in the first and second channels respectively, so that the first and second channels with the conductive material respectively penetrate the piezoelectric units.

According to the present disclosure, a method for manufacturing a multi-layer stacked-type piezoelectric device. First, several first and second insulated piezoelectric bodies are formed. Each of the first and second insulated piezoelectric bodies includes a piezoelectric layer having an upper surface and a lower surface, a conductive layer formed on the upper surface of the piezoelectric layer, and the first and second insulating portions respectively formed at a left half and a right half of the conductive layers of the first and second insulated piezoelectric bodies. Next, the first and second insulated piezoelectric bodies are stacked staggeredly for forming a stacked-type assembly. Then, the portions corresponding to the first and second insulating materials of the stacked-type assembly are drilled, for forming the first and second channels. The size of the first and second channels is less than that of the first and second insulating materials. As a result, the first and second insulating portions are formed respectively in the conductive layers of the first and second insulated piezoelectric bodies. Later, the first and second channels are respectively filled with conductive material, so that the first and second channels with the conductive material respectively penetrate the insulated piezoelectric bodies.

According to the present disclosure, a method for manufacturing a multi-layer stacked-type piezoelectric device. First, several first and second piezoelectric bodies are formed. Each of the first and second piezoelectric bodies includes a piezoelectric layer having an upper surface and a lower surface, and a conductive layer formed on the upper surface of the piezoelectric layer. An first opening and an second opening are formed respectively on each of the conductive layers of the first and second piezoelectric bodies. The first openings are formed at the left half of the piezoelectric layers, and the second openings are formed at the right half of the piezoelectric layers. Next, the first and second piezoelectric bodies are stacked staggeredly, for forming a stacked-type assembly. Then, the stacked-type assembly corresponding to the first and second openings is drilled to form the first and second channels. The size of the first and second channels is less than that of the first and second openings. Later, the first and second channels and the first and second openings are filled with an insulating material. Thereon, the first and second channels are drilled again to remove the insulating material in the first and second channels. After the drilling step, the first and second insulating portions are formed in the conductive layers of the first and second piezoelectric bodies. Subsequently, the first and second channels are filled with conductive material.

The disclosure will become apparent from the following detailed description of the exemplary but non-limiting embodiments. The following description is made with reference to the accompanying drawings.

DETAILED DESCRIPTION

A stacked-type piezoelectric device including at least two piezoelectric layers is provided by the present disclosure. Each piezoelectric layer has at least two contact holes. A conductive layer is formed on at least one surface of each piezoelectric layer. When stacked, several piezoelectric layers are staggered and rotated in a plane. As a result, the contact holes of the piezoelectric layers are aligned with each other precisely. Conductive material is filled in the contact holes for forming micro-actuators having positive and negative electrodes. In a stacked-type piezoelectric device of the present disclosure, the piezoelectric layers are drilled and then filled with the conductive material for forming staggered positive and negative electrodes which penetrate the piezoelectric material. There is no need to use the frame which is used in the conventional piezoelectric actuator to fasten the piezoelectric material. The actuator deforms and expands evenly, which results in less damage and fractures due to excessive tensile stress. The size is reduced significantly, and the appearance is simplified. Therefore, a small-size actuator can be formed.

Four embodiments are provided for demonstrating the structure of stacked-type piezoelectric device of the present disclosure and method for manufacturing the same. However, the embodiments disclosed herein are used for illustrative purpose, but not for limiting the scope of the disclosure. Also, it is known for people skill in the art that the structure presented in the embodiments and drawings could be slightly modified under the spirit of the disclosure. The specification and the drawings are to be regard as an illustrative sense rather than a restrictive sense. Additionally, the drawings used for illustrating the embodiments and applications of the present disclosure only show the major characteristic parts in order to avoid obscuring the present disclosure.

Figure 1:
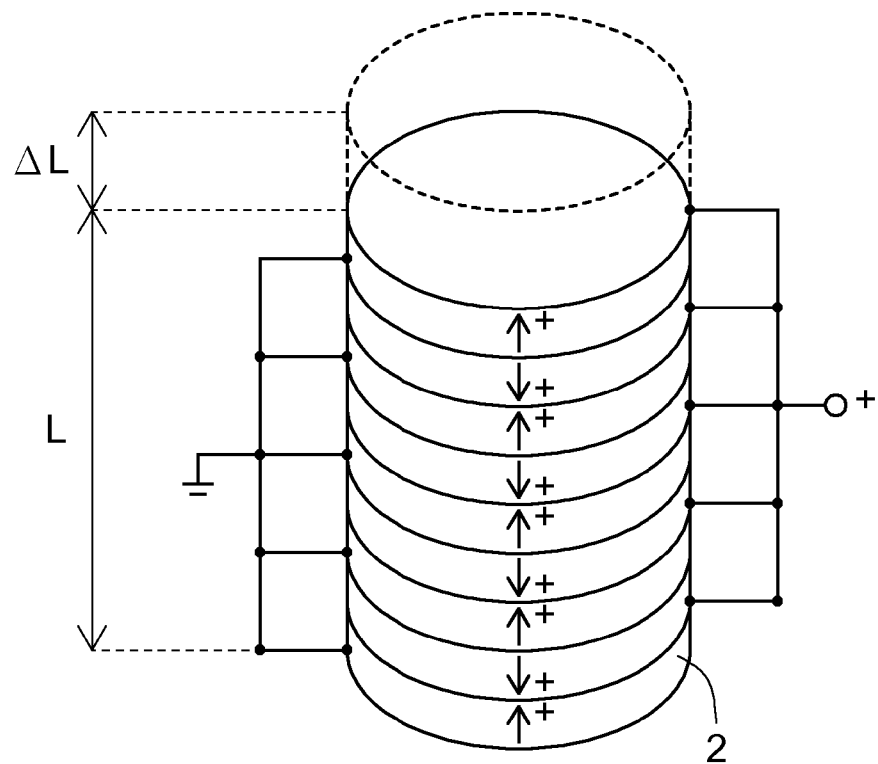
FIG. 1 (PRIOR ART) illustrates a stacked-type piezoelectric actuator.
Figure 2:
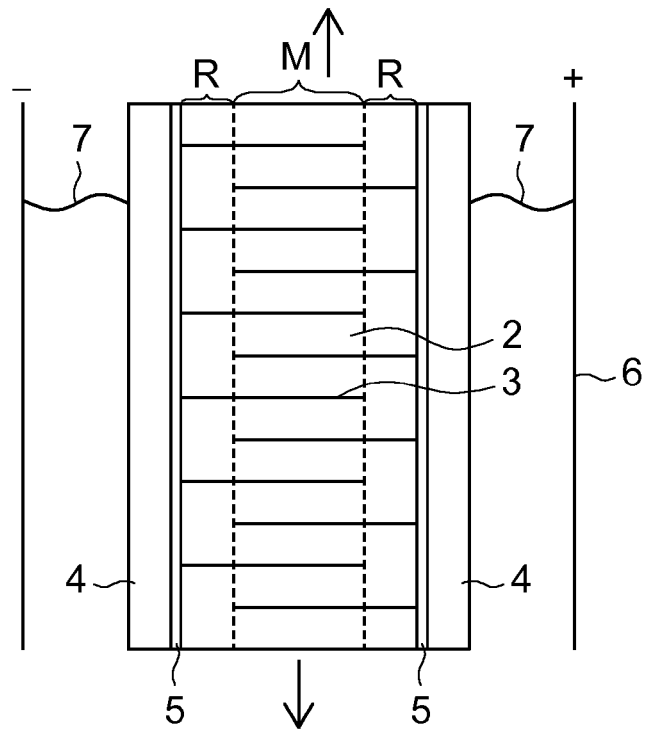
FIG. 2 (PRIOR ART) illustrates the structure of a conventional piezo-actuator.
Figure 3A:
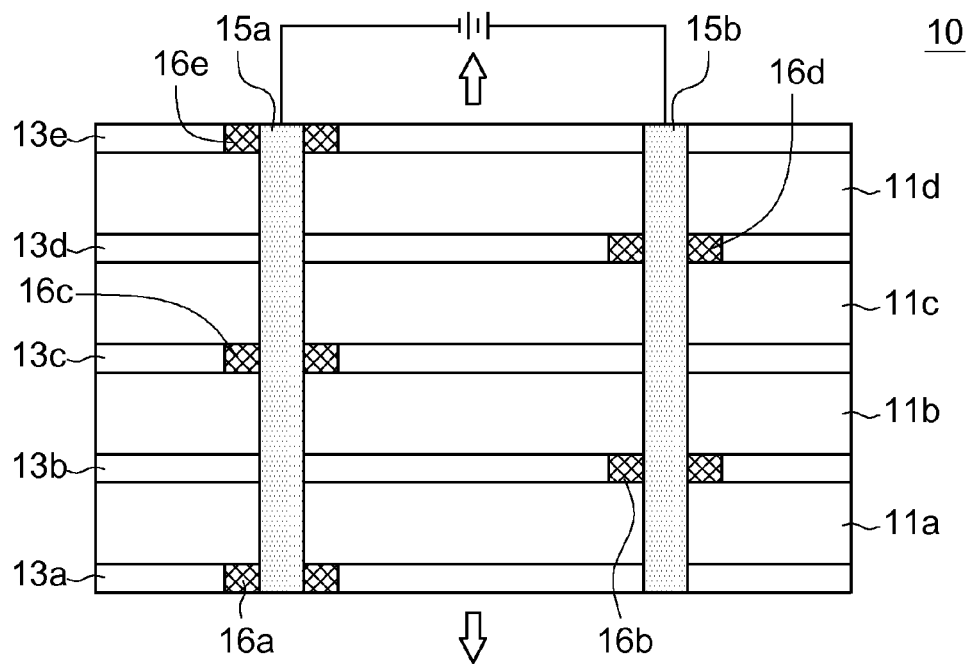
FIG. 3A illustrates a stacked-type piezoelectric device according to an exemplary embodiment of the present disclosure.

Please refer to FIG. 3A. FIG. 3A illustrates a stacked-type piezoelectric device according to an embodiment of the present disclosure. The stacked-type piezoelectric device 10 includes several piezoelectric layers 11a~11d, several conductive layers 13a~13e, the first contact hole 15a, the second contact hole 15b and several insulating portions 16a~16e. The piezoelectric layers 11a~11d are disposed between the conductive layers 13a~13e. The first contact hole 15a and the second contact hole 15b at least penetrate the piezoelectric layers 11a~11d. For example, the first contact hole 15a and the second contact hole 15b respectively penetrate two lateral sides of the piezoelectric layers 11a~11d and the conductive layers 13a~13e. Each of the first contact hole 15a and the second contact hole 15b is filled with conductive material. In an embodiment, the first contact hole 15a and the second contact hole 15b respectively penetrate two lateral sides of the piezoelectric layers 11a~11d and the conductive layers 13a~13e vertically. However, the present disclosure does not limit the way that the contact holes penetrate the layers.

The insulating portions 16a~16e are respectively formed in the conductive layers 13a~13e correspondingly. Two adjacent insulating portions are formed at the outer rims of the first contact hole 15a and the second contact hole 15b respectively, to electrically isolate the conductive layer in which the insulating portion is formed from the conductive material in the contact hole. For example, the insulating portion 16a is formed in the conductive layer 13a, and the insulating portion 16b is formed in the conductive layer 13b. The two adjacent insulating portions 16a and 16b are at the outer rims of the first contact hole 15a and the second contact hole 15b respectively. As a result, the conductive layers 13a and 13b are electrically isolated from the conductive materials in the first contact hole 15a and the second contact hole 15b due to the existence of the insulating portions 16a and 16b. Similarly, the conductive layers 13c and 13e are electrically isolated from the conductive material in the first contact hole 15a due to the existence of the insulating portions 16c and 16e. The conductive layer 13d is electrically isolated from the conductive material in the second contact hole 15b due to the existence of the insulating portion 16d.

Furthermore, although different patterns are used in FIG. 3A for representing the locations of the first contact hole 15a, the second contact hole 15b and the conductive layers 13a~13c, the conductive material in the first contact hole 15a and the second contact hole 15b can be the same as or different from the conductive material of the conductive layers 13a~13c practically. The present disclosure is not limited thereto.

When the stacked-type piezoelectric device 10 in FIG. 3A is in use, the first contact hole 15a and the second contact hole 15b can be electrically connected with the negative and positive electrodes of a source respectively. When an operating voltage is applied to the stacked-type piezoelectric device 10, the first contact hole 15a and the conductive layers 13d and 13b carry negative charge, and the second contact hole 15b and the conductive layers 13e, 13c and 13a carry positive charge. As a result, the piezoelectric layers 11a~11d between the conductive layers 13a~13e deform and expand along the directions indicated by the arrows.

The stacked-type piezoelectric device 10 does not have the frame which is used in the conventional piezoelectric actuator for fastening the piezoelectric layers. Therefore, the piezoelectric layers 11a~11d are able to expand evenly in a plane with less damage due to excessive tensile stress. Moreover, the first contact hole 15a and the second contact hole 15b only occupy a small area of the piezoelectric layers 11a~11d. As a result, for the piezoelectric layers of the same size, the stacked-type piezoelectric device 10 of the present disclosure has larger ratio of the effect area to perform piezoelectric effect than the conventional piezoelectric actuator. Besides, as to the appearance of both devices, the volume of the stacked-type piezoelectric device 10 of the present disclosure only includes the stacked piezoelectric layers 11a~11d and the conductive layers 13a~13e. Therefore, compared to the conventional piezoelectric actuator which needs a fastening frame, the device of the present disclosure has much less volume.

Figure 3B:
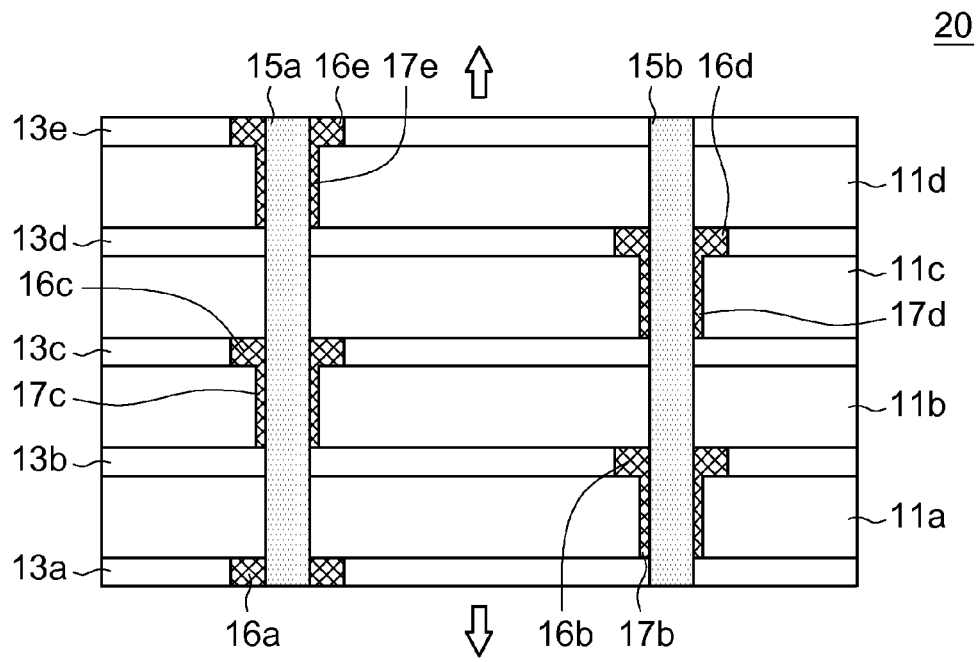
FIG. 3B illustrates another piezoelectric device according to the exemplary embodiment of the present disclosure.

Please refer to FIG. 3B. FIG. 3B illustrates a piezoelectric device according to another exemplary embodiment of the present disclosure. The identical components shown in FIG. 3B and FIG. 3A are denoted as the same reference numbers. Compared to the device in FIG. 3A, the device in FIG. 3B has similar structure except that the device in FIG. 3B further includes several insulation sidewalls 17b~17e which are connected to the insulating portions 16b~16e perpendicularly. Also, the insulation sidewalls 17b~17e are located between the piezoelectric layers and the first and second contact holes 15a and 15b, to electrically isolate the piezoelectric layers from the conductive material in the contact holes 15a and 15b. When an operating voltage is applied to the stacked-type piezoelectric device 20, the insulation sidewalls 17b~17e prevent the piezoelectric layers 11a~11d from lateral deformation and expansion. As a result, the piezoelectric layers 11a~11d only expand along the direction indicated by the arrows.

For example, the insulation sidewall 17b connected to the insulating portion 16b is located between the piezoelectric layer 11a and the second contact hole 15b, to electrically isolate the piezoelectric layer 11a from the conductive material in the second contact hole 15b. Similarly, the insulation sidewall 17d electrically isolates the piezoelectric layer 11c from the conductive material in the second contact hole 15b. The insulation sidewall 17c electrically isolates the piezoelectric layer 11b from the conductive material in the first contact hole 15a. The insulation sidewall 17e electrically isolates the piezoelectric layer 11d from the conductive material in the first contact hole 15a.

Although the stacked-type piezoelectric devices in FIG. 3B and FIG. 3A include four piezoelectric layers 11a~11d as examples, the present disclosure does not limit the number of the piezoelectric layers. The present disclosure encompasses the stacked-type piezoelectric devices having at least two piezoelectric layers. In other words, the stacked-type piezoelectric device provided by the present disclosure includes n piezoelectric layers and (n+1) conductive layers. n is an positive integer not less than 2. The piezoelectric layers are staggered between the conductive layers. The insulating portions of the odd-numbered conductive are corresponding to the outer rims of the first contact hole. The insulating portions of the even-numbered conductive layers are corresponding to the outer rims of the second contact hole.

Several exemplary embodiments are provided by the present disclosure according to the above-described piezoelectric device for illustrating at least four methods for manufacturing the stacked-type piezoelectric device. However, the detailed steps of the manufacturing methods and the structures revealed in the embodiments are used as examples and not to limit the present disclosure. Moreover, the drawings of the embodiments only show the components related to the present disclosure. Unnecessary components are neglected for clarity.

First Embodiment

In the first embodiment, several piezoelectric unit structures are manufactured first. Conductive layers are formed on the upper and lower surfaces of the piezoelectric layers in each piezoelectric unit structure, and the contact holes penetrate the structure vertically. Then, the piezoelectric unit structures are stacked together, and the conductive material is filled in the contact holes. Insulation sidewalls and insulating portions are formed in each piezoelectric unit structure as shown in FIG. 3B.

Please refer to FIG. 4A~4H, which show the flow of the method for manufacturing a single piezoelectric unit structure according to the first embodiment of the present disclosure.

Figure 4A:
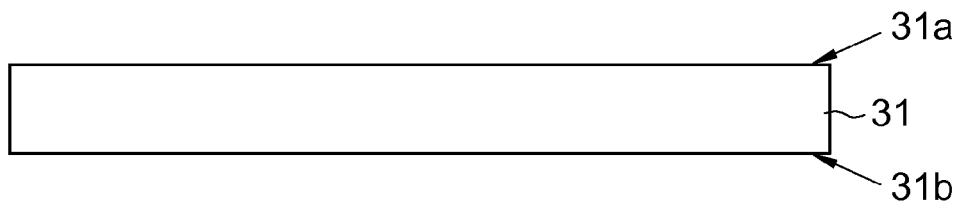
FIG. 4A~FIG. 4H show the flow of the method for manufacturing a single piezoelectric unit structure according to the first embodiment of the present disclosure.
Figure 4B:
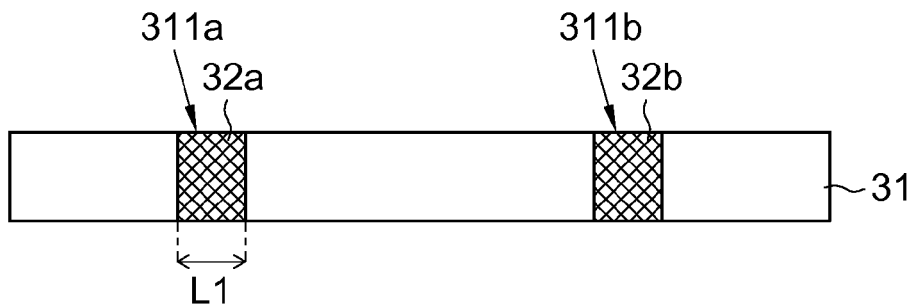

As shown in FIG. 4A, a piezoelectric layer 31 is provided first, and the piezoelectric layer 31 has an upper surface 31a and a lower surface 31b. Next, the first penetrating hole 311a and the second penetrating hole 311b are formed on both sides of the piezoelectric layer 31, and the insulating materials 32a and 32b are filled in the first penetrating hole 311a and the second penetrating hole 311b respectively, as shown in FIG. 4B. The first penetrating hole 311a and the second penetrating hole 311b vertically penetrate the piezoelectric layer 31. After the insulating materials 32a and 32b are filled in the first penetrating hole 311a and the second penetrating hole 311b, the surfaces of the insulating materials 32a and 32b are aligned with the upper and lower surfaces 31a and 31b of the piezoelectric layer 31 respectively. The insulating materials 32a and 32b may be non-conductive adhesive, such as epoxy or other non-conductive materials. The shape of the first penetrating hole 311a and the second penetrating hole 311b has no limitation and can be a circle, ellipse, rectangle or any other shape. In the present embodiment, the first penetrating hole 311a and the second penetrating hole 311b are circular as an example and has the same penetrating diameter $L_1$.

Figure 4C:
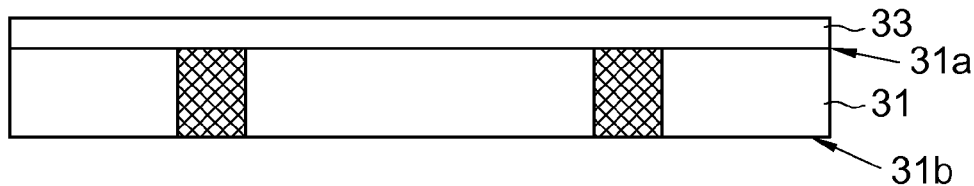
Figure 4D:
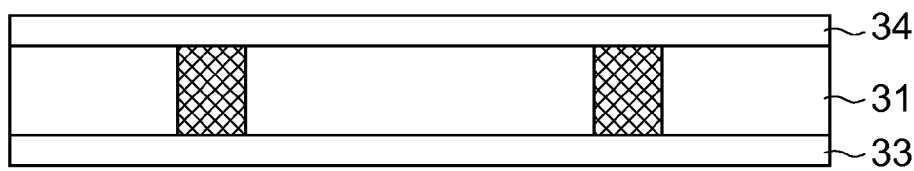

Then, as shown in FIG. 4C, the first conductive layer 33 is formed on the upper surface 31a of the piezoelectric layer 31. Subsequently, as shown in FIG. 4D, the piezoelectric layer 31 is turned upside down, and the second conductive layer 34 is formed on the lower surface 31b of the piezoelectric layer 31. The first and second conductive layers 33 and 34 cover the insulating materials 32a and 32b respectively.

Figure 4E:
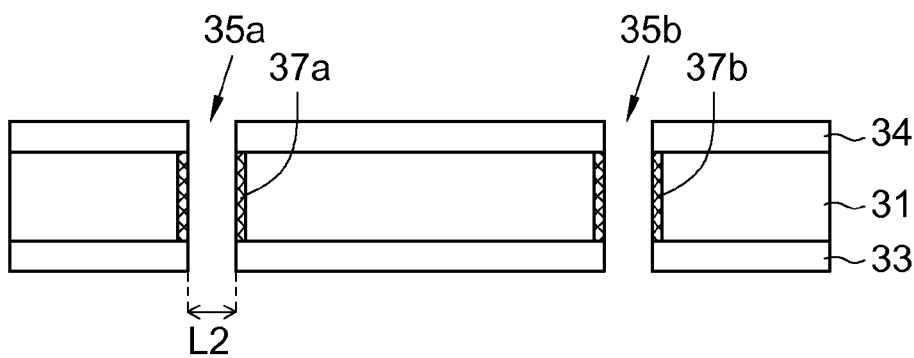

Thereon, as shown in FIG. 4E, the first contact hole 35a and the second contact hole 35b are formed corresponding to the first penetrating hole 311a and the second penetrating hole 311b respectively by drilling. The diameter $L_2$ of the drilled first contact hole 35a and the second contact hole 35b is less than the diameter $L_1$ of the first penetrating hole 311a and the second penetrating hole 311b. The first insulating sidewall 37a and the second insulating sidewall 37b are formed accordingly. The first contact hole 35a and 35b vertically penetrate the second conductive layer 34, the piezoelectric layer 31 and the first conductive layer 33 respectively.

Figure 4F:
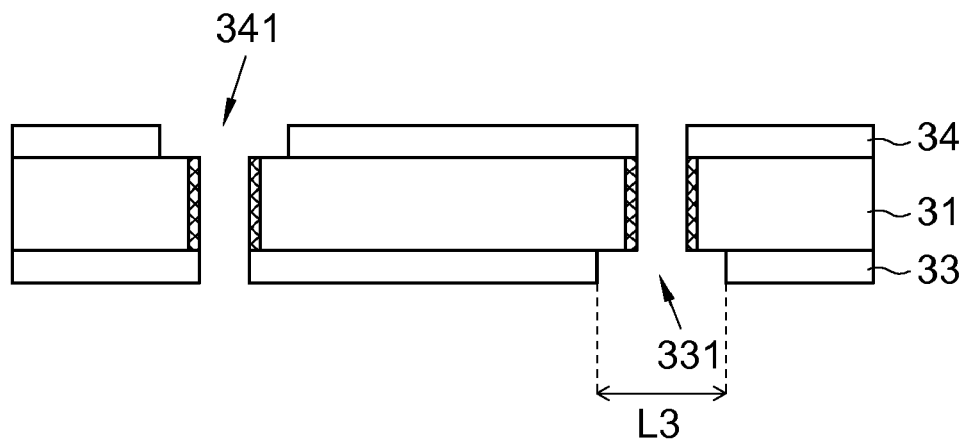

Later, a portion of the conductive layers on the upper and lower sides of the piezoelectric layer 31 corresponding to the outer rims of the first contact hole 35a and the second contact hole 35b is removed. As shown in FIG. 4F, a portion of the second conductive layer 34 corresponding to the outer rim of the first contact hole 35a is removed for forming an opening 341. A portion of the first conductive layer 33 corresponding to the outer rim of the second contact hole 35b is removed for forming an opening 331. The diameter $L_3$ of the openings 331 and 341 is larger than the diameter $L_2$ of the first contact hole 35a and the second contact hole 35b and the diameter $L_1$ of the first penetrating hole 311a and the second penetrating hole 311b. Also, there is no limitation on the shape of the openings 331 and 341. The openings 331 and 341 can be circular, elliptical, rectangular or any other shape.

Figure 4G:
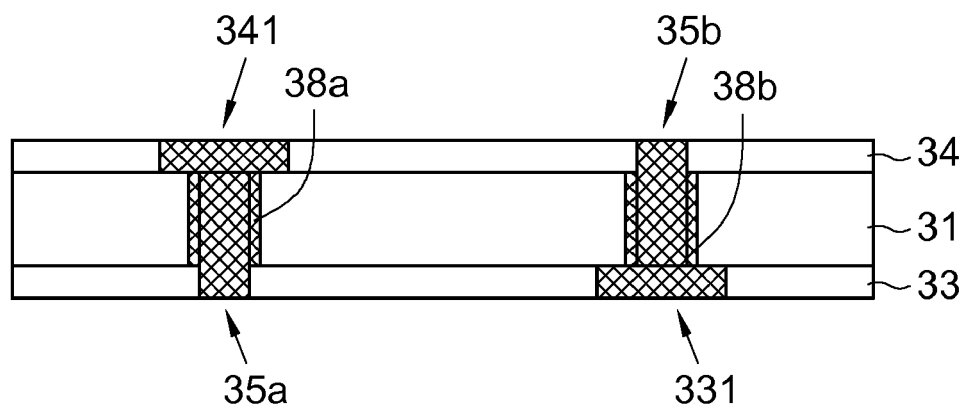

Then, as shown in FIG. 4G, the insulating materials 38a and 38b are filled in the first contact hole 35a and the second contact hole 35b. Also, the insulating material 38a and 38b are fully filled in the openings 331 and 341. The surfaces of the insulating materials 38a and 38b are aligned with the upper and lower surfaces of the first and second conductive layers 33 and 34 respectively.

Figure 4H:
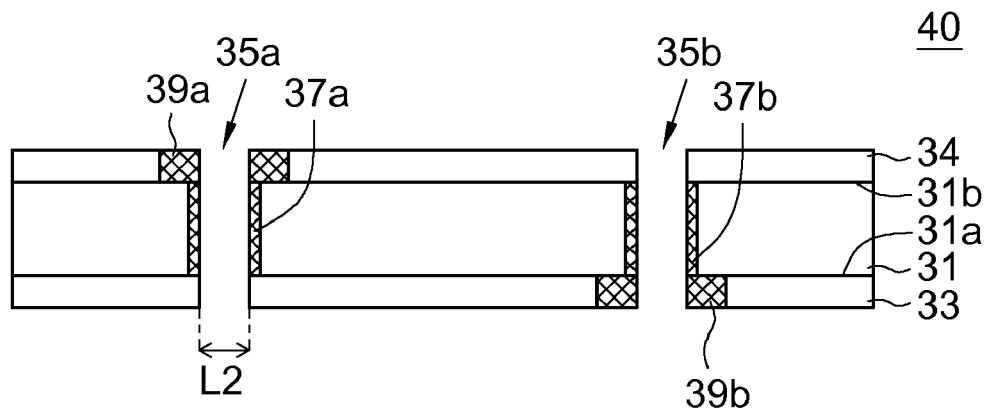

Next, as shown in FIG. 4H, drilling is performed on the first contact hole 35a and the second contact hole 35b for leaving the insulating material at the outer rims of the first contact hole 35a and the second contact hole 35b to form the first insulating portion 39a and the second insulating portion 39b. After drilling, the first insulation sidewall 37a is located between the first contact hole 35a and the piezoelectric layer 31 and connected to the first insulating portion 39a. The second insulation sidewall 37b is located between the second contact hole 35b and the piezoelectric layer 31 and connected to the second insulating portion 39b. Furthermore, one end of the first insulation side wall 37a is aligned with the lower surface 31a of the piezoelectric layer 31, and one end of the second insulation side wall 37b is aligned with the upper surface 31b of the piezoelectric layer 31. As to the selection of the material, the insulating materials 38a and 38b of the first and second insulating portions 39a and 39b can be the same as or different from the insulating materials 32a and 32b of the first and second insulation sidewalls 37a and 37b, which depends on the practical conditions. The present disclosure is not limited thereto.

Following the above-described steps in FIG. 4A~4H, a piezoelectric unit structure 40 can be manufactured accordingly.

Next, several piezoelectric unit structures 40 in FIG. 4H are stacked vertically. The conductive materials are filled in the contact holes to form a multi-layer stacked-type piezoelectric device. Thus, the deformation driven by the piezoelectric device when in use is increased, or greater electric current is generated. When stacked in a staggered manner, the piezoelectric unit structure 40 is laterally rotated 180° and then stacked on another piezoelectric unit structure 40.

Figure 5A:
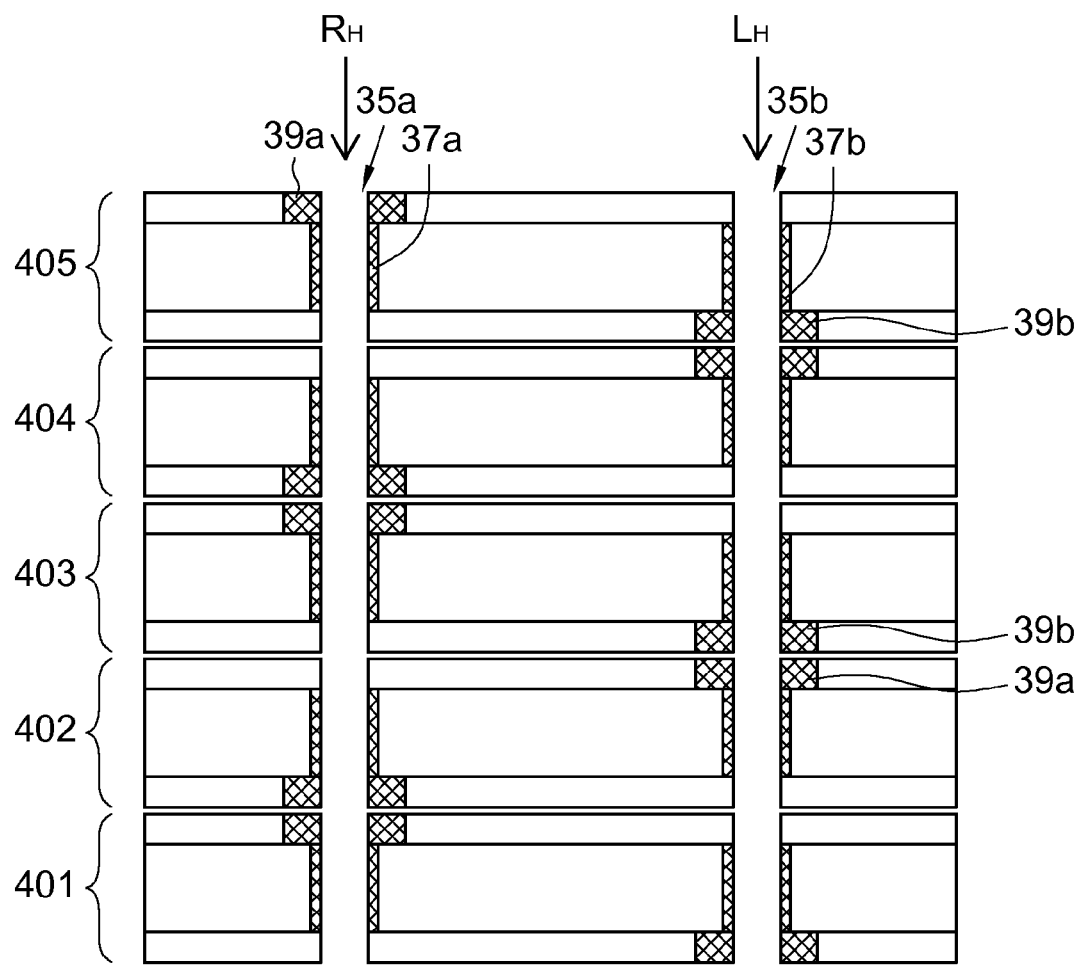
FIG. 5A~FIG. 5B illustrate the flow of a method for manufacturing a stacked-type piezoelectric device according to the first embodiment of the present disclosure.
Figure 5B:
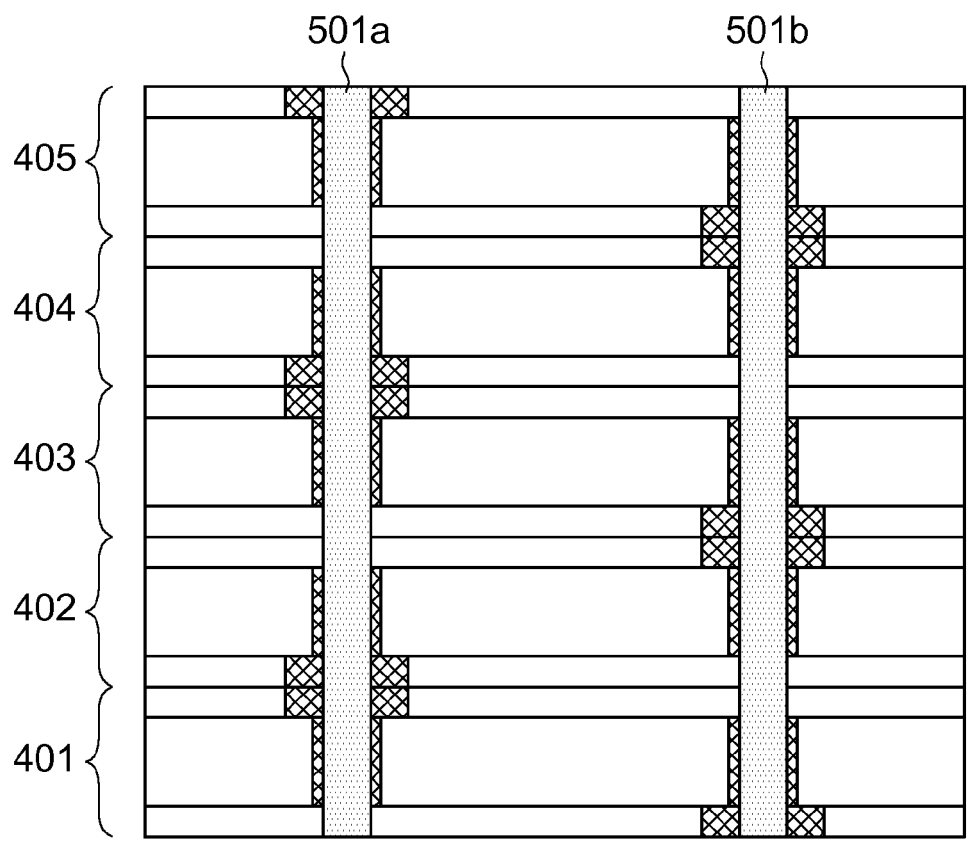
Figure 6A:
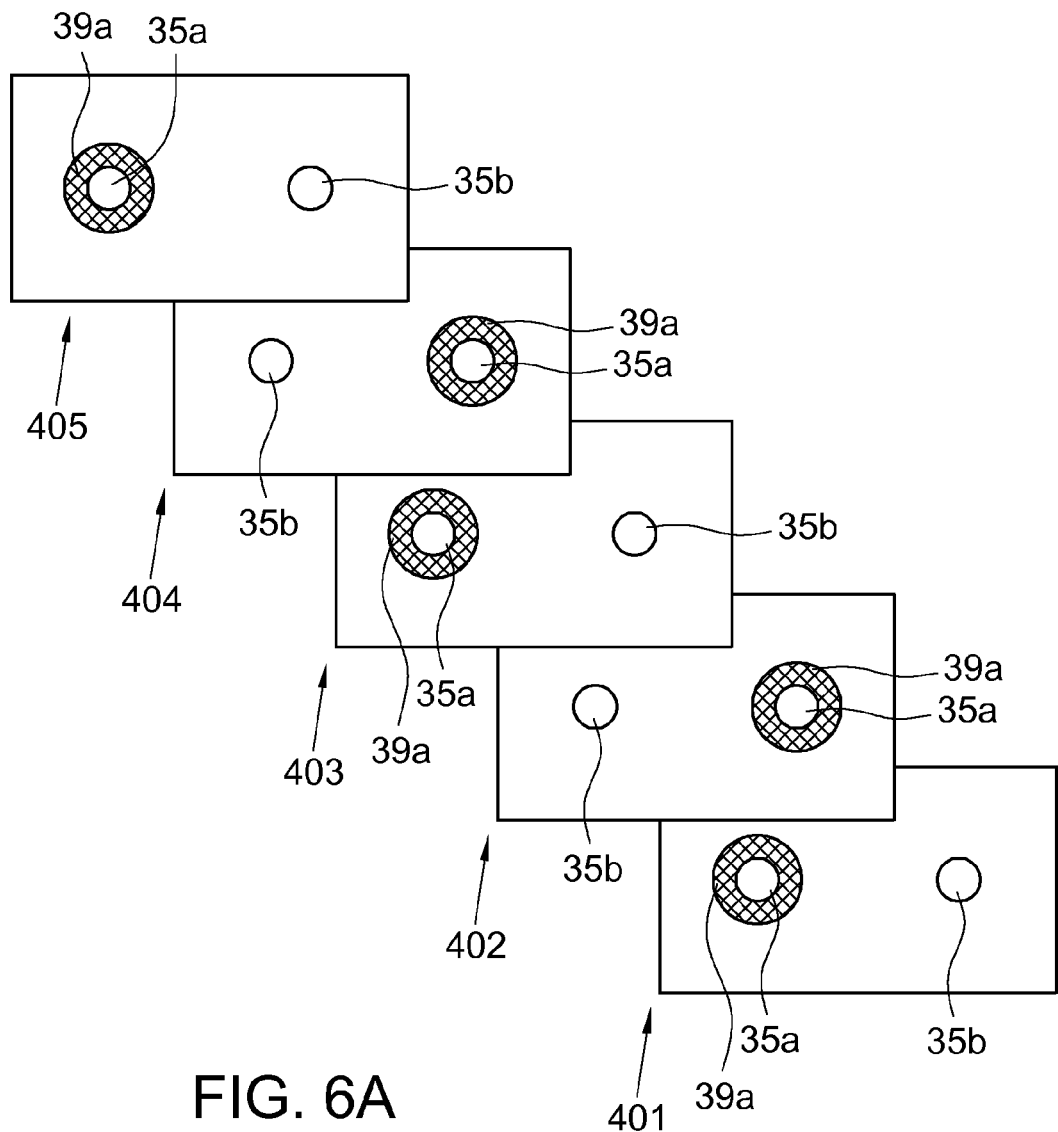
FIG. 6A~FIG. 6B are the top views of FIG. 5A~FIG. 5B respectively.
Figure 6B:
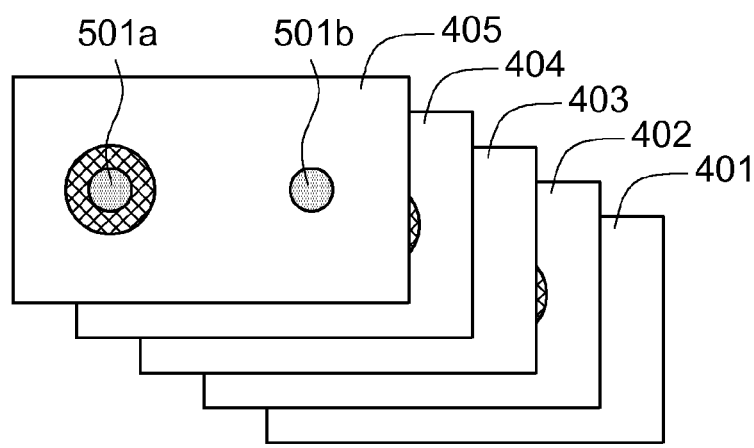

FIG. 5A~FIG. 5B illustrate the flow of a method for manufacturing a stacked-type piezoelectric device according to the first embodiment of the present disclosure. FIG. 6A~FIG. 6B are the top views of FIG. 5A~FIG. 5B respectively. Please refer to FIG. 5A~FIG. 5B and FIG. 6A~FIG. 6B at the same time. Five piezoelectric unit structures in FIG. 4G are stacked as an example for illustrating the present embodiment.

As shown in FIG. 5A and FIG. 6A, several piezoelectric unit structures 401~405 are stacked vertically. When stacked, one piezoelectric unit structure is laterally rotated 180° and then stacked on another piezoelectric unit structure. For example, after laterally rotated 180°, the first contact hole 35a of the piezoelectric unit structure 402 is aligned with the second contact hole 35b of the lower adjacent piezoelectric unit structure 401. Similarly, the first contact hole 35a of the piezoelectric unit structure 404 is aligned with the second contact hole 35b of the lower adjacent piezoelectric unit structure 403. Also, as shown in FIG. 5A, the first insulating portion 39a of the stacked piezoelectric unit structure 403 contacts the second insulating portion 39b of the upper adjacent piezoelectric unit structure 404. The first contact holes 35a and the second contact holes 35b of the stacked piezoelectric unit structures 401~405 form the first channel $R_H$ and the second channel $L_H$.

Later, as shown in FIG. 5B and FIG. 6B, the conductive materials 501a and 501b are filled in the first channel $R_H$ and the second channel $L_H$ respectively for forming a stacked-type piezoelectric device 50. The first channel $R_H$ and the second channel $L_H$ vertically penetrate the piezoelectric unit structures 401~405. The conductive materials 501a and 501b may be conductive adhesive (such as silver paste) or tin/lead solder for example.

Figure 7:
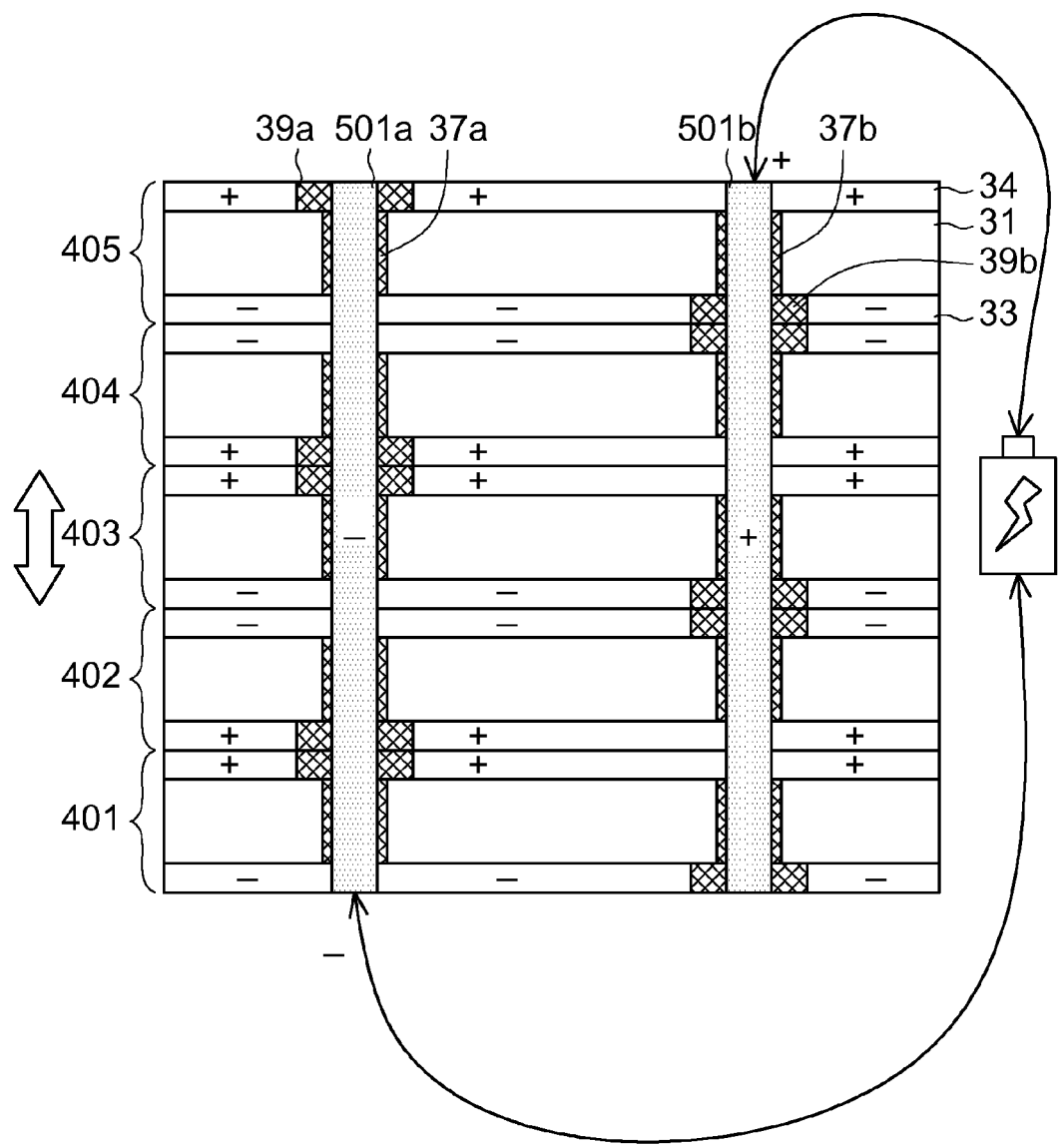
FIG. 7 illustrates the stacked-type piezoelectric device according to the first embodiment of the present disclosure.

FIG. 7 illustrates the stacked-type piezoelectric device according to the first embodiment of the present disclosure. When the stacked-type piezoelectric device 50 in FIG. 5B is in practical use, the conductive material 501a in the first channel $R_H$ and the conductive material 501b in the second channel $L_H$ are electrically connected to the negative and positive electrodes of an external source respectively. When an operating voltage is applied to the stacked-type piezoelectric device 50, the piezoelectric layers between the electrode layers deform and expand along the directions indicated by the arrows. Anyone who has ordinary skill in the field of the present disclosure can understand that when in practical use, a constant voltage can be applied to the stacked-type piezoelectric device 50 for generating specific deformation. Or, an alternative current can be applied to the stacked-type piezoelectric device 50 for generating high-frequency vibration. Or, the stacked-type piezoelectric device 50 is deformed to generate electric current. Modification can be made depending on the practical conditions.

The piezoelectric unit structure in FIG. 4H manufactured following the steps in FIG. 4A~FIG. 4H mainly includes the piezoelectric layer 31, the first and second conductive layers 33 and 34 respectively formed above and under the piezoelectric layer 31, the first and second contact holes 35a and 35b vertically penetrating the piezoelectric layer 31, the first conductive layer 33 and the second conductive layer 34, the first and second insulating portions 39a and 39b respectively formed in the first and second conductive layers 33 and 34 respectively surrounding the outer rims of the first and second contact holes 35a and 35b, and the first and second insulation sidewalls 37a and 37b respectively connected to the first and second insulating portions 39a and 39b. What is worth mentioning is that when the conductive materials are directly filled in the first and second contact holes 35a and 35b, a piezoelectric device with a single-layer piezoelectric layer can be formed accordingly.

A stacked-type piezoelectric device 50 can be formed by stacking the piezoelectric unit structures as shown in FIG. 4H following the steps in FIG. 5A~FIG. 5B. Piezoelectric effect occurs in the piezoelectric layers 31 under the action of the electric field due to the locations of the first and second insulating portions 39a and 39b and the first and second insulation sidewalls 37a and 37b. FIG. 7 shows the polarity of each piezoelectric layer and the first and second conductive layers of the device 50 when the conductive materials 501a and 501b respectively in the first channel $R_H$ and the second channel $L_H$ are electrically connected to the negative and positive electrodes of an external source. The insulating portions are used for electrically isolating the conductive layers from the conductive materials in some of the adjacent contact holes. The insulating sidewalls are used for electrically isolating the piezoelectric layers from the conductive materials in the adjacent contact holes.

What is worth mentioning is that although the conductive layers are formed on the upper and lower surfaces of each piezoelectric unit structure in the stacked-type piezoelectric device 50, the two adjacent conductive layers between the stacked piezoelectric layers in FIG. 7 can still be considered to be a single layer, compared to the structure in FIG. 3B. Therefore, the present disclosure encompasses the stacked-type piezoelectric device 50 according to the first embodiment of the present disclosure.

Second Embodiment

In the second embodiment, several piezoelectric unit structures with conductive layers on both the upper and lower surfaces and the contact holes penetrating the structure are formed first, which is the same as the first embodiment. Next, the piezoelectric unit structures are stacked, and the conductive materials are filled in the contact holes. The difference between the second and first embodiments is that only the insulating portion but no insulation sidewall is formed in the piezoelectric unit structure according to the second embodiment. The stacked-type piezoelectric device according to the second embodiment is encompassed by the technical field in FIG. 3A of the present disclosure.

Please refer to FIG. 8A~FIG. 8H, which illustrate the flow of a method for manufacturing the stacked-type piezoelectric device according to the second embodiment of the present disclosure.

Figure 8A:
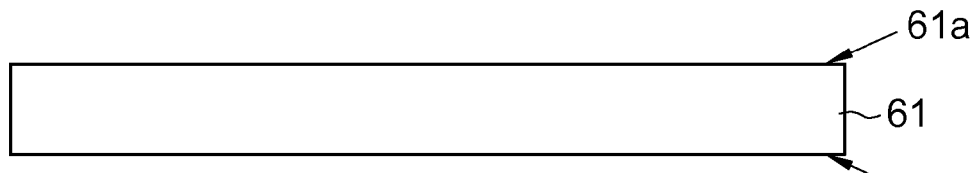
FIG. 8A~FIG. 8H illustrate the flow of a method for manufacturing the stacked-type piezoelectric device according to the second embodiment of the present disclosure.
Figure 8B:
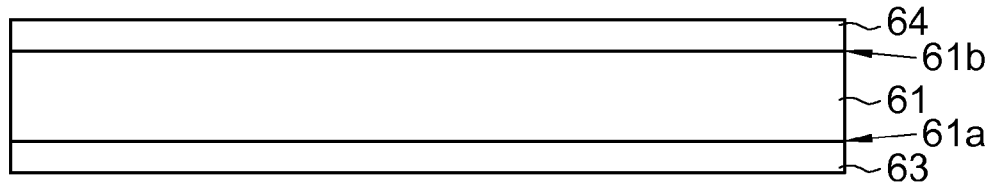

First, as shown in FIG. 8A, a piezoelectric layer 61 is provided. The piezoelectric layer 61 has an upper surface 61a and a lower surface 61b. Next, as shown in FIG. 8B, the first conductive layer 63 and the second conductive layer 64 are respectively formed on the upper and lower surfaces 61a and 61b of the piezoelectric layer 61.

Figure 8C:
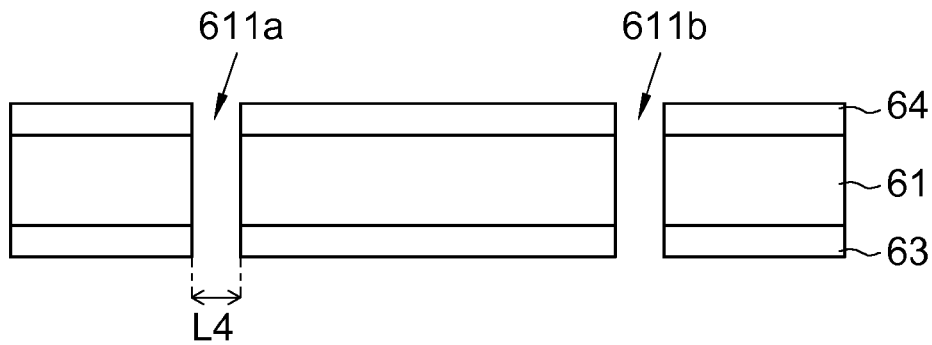

Then, as shown in FIG. 8C, the first penetrating hole 611a and the second penetrating hole 611b are respectively formed on both sides of the piezoelectric layer 61. The first penetrating hole 611a and the second penetrating hole 611b vertically penetrate the second conductive layer 64, the piezoelectric layer 61 and the first conductive layer 63. There is no limitation on the shape of the penetrating holes 611a and 611b. In the present embodiment, the first penetrating hole 611a and the second penetrating hole 611b are circular and have the same penetrating diameter $L_4$ as an example.

Figure 8D:
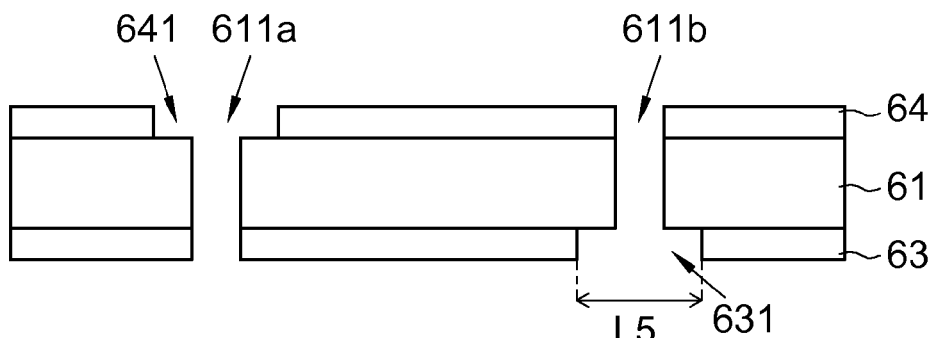

Subsequently, as shown in FIG. 8D, a portion of the conductive layers above and under the piezoelectric layer 61 corresponding to the first and second penetrating holes 611a and 611b is removed. For example, a portion of the second conductive layer 64 corresponding to the first penetrating hole 611a is removed to form an opening 641. A portion of the first conductive layer 63 corresponding to the second penetrating hole 611b is removed to form an opening 631. The diameter $L_5$ of the openings 631 and 641 is larger than the diameter $L_4$ of the first and second penetrating holes 611a and 611b. Moreover, there is no limitation on the shape of the openings 631 and 641. The openings 631 and 641 can be circular, elliptical, rectangular or any other shape.

Figure 8E:
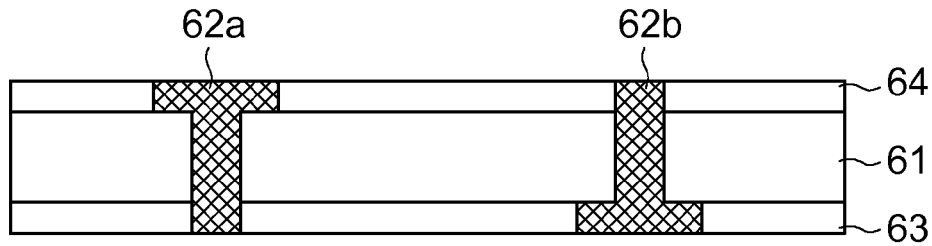

Later, as shown in FIG. 8E, the insulating materials 62a and 62b are filled in the first and second penetrating holes 611a and 611b. The insulating materials 62a and 62b are also fully filled in the openings 631 and 641. The exposed surfaces of the insulating materials 62a and 62b are aligned with the upper and lower surfaces of the first and second conductive layers 63 and 64 after the filling step. The insulating materials 62a and 62b are non-conductive adhesive for example, such as epoxy or other non-conductive materials.

Figure 8F:
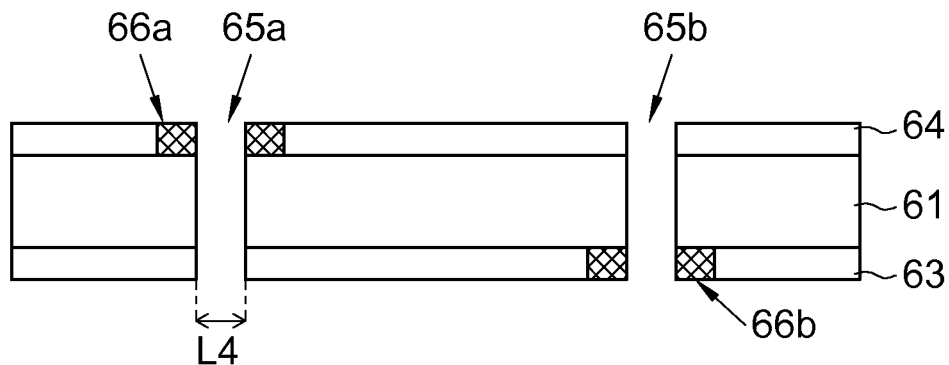

Thereon, as shown in FIG. 8F, the places corresponding to the first and second penetrating holes 611a and 611b are drilled to form the first and second contact holes 65a and 65b respectively. The diameter $L_4$ of the first and second contact holes 65a and 65b is the same as the diameter $L_4$ of the first and second penetrating holes 611a and 611b. The first and second contact holes 65a and 65b vertically penetrate the second conductive layer 64, the piezoelectric layer 61 and the first conductive layer 63 respectively. After the drilling step, the insulating materials are left at the places corresponding to the outer rims of the first and second contact holes 65a and 65b to form the first and second insulating portions 66a and 66b. The first and second insluting portions 66a and 66b are respectively on the upper and lower sides of the piezoelectric layer 61.

A piezoelectric unit structure is formed following the steps in FIG. 8A~FIG. 8F.

Figure 8G:
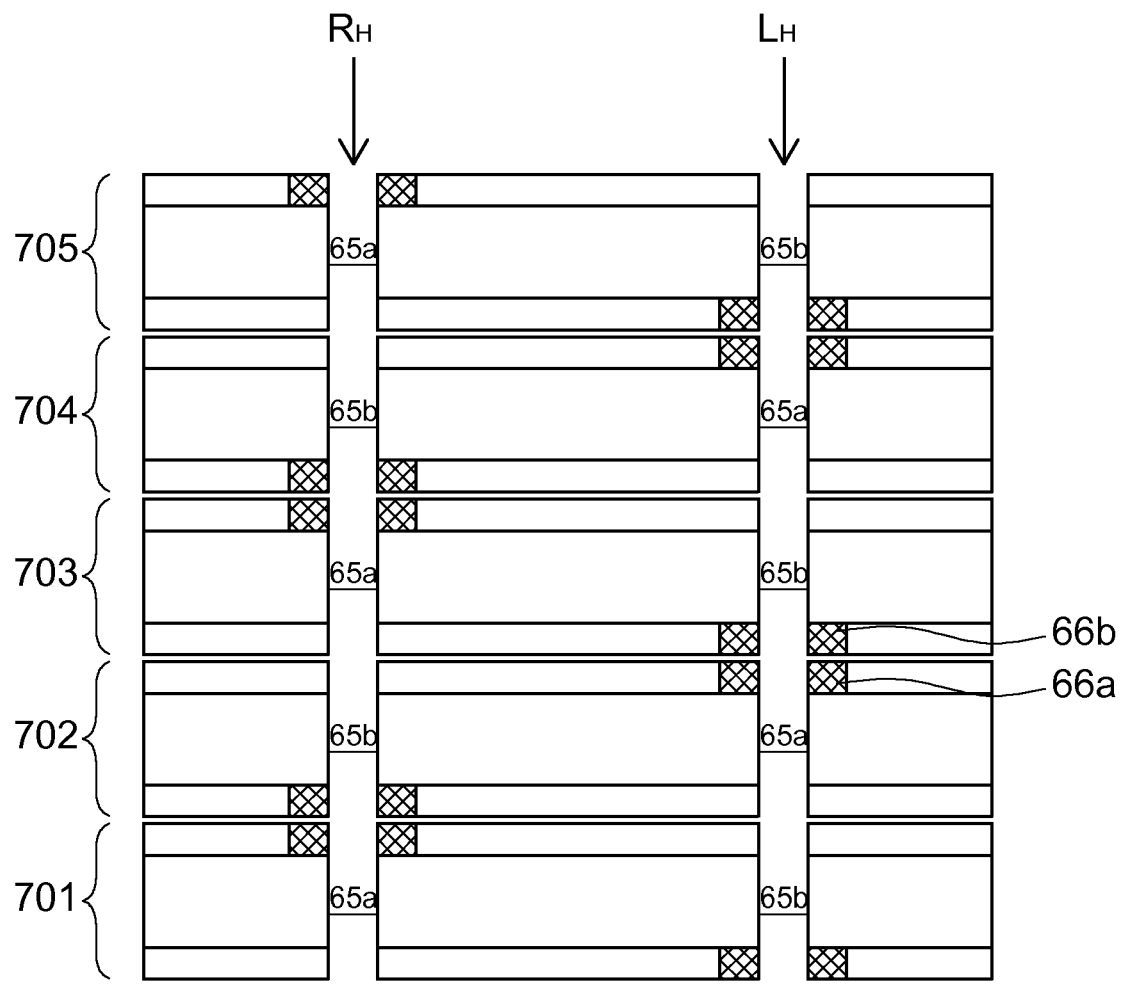

Then, as shown in FIG. 8G, several piezoelectric unit structures 701~705 in FIG. 8F are stacked vertically. When stacked, the piezoelectric unit structure is laterally rotate 180° and then stacked on another piezoelectric unit structure. For example, after laterally rotated 180°, the first contact hole 65a of the piezoelectric unit structure 702 is aligned with the second contact hole 65b of the lower adjacent piezoelectric unit structure 701. Similarly, the first contact hole 65a of the piezoelectric unit structure 704 is aligned with the second contact hole 65b of the lower adjacent piezoelectric unit structure 703. Also, the first insulating portion 66a of the stacked piezoelectric unit structure contacts the second insulating portion 66b of the adjacent piezoelectric unit structure. For example, the first insulating portion 66a of the piezoelectric unit structure 703 contacts the second insulating portion 66b of the upper adjacent piezoelectric unit structure 704. The first contact holes 65a and the second contact holes 65b of the stacked piezoelectric unit structures 701~705 form the first channel $R_H$ and the second channel $L_H$.

Figure 8H:
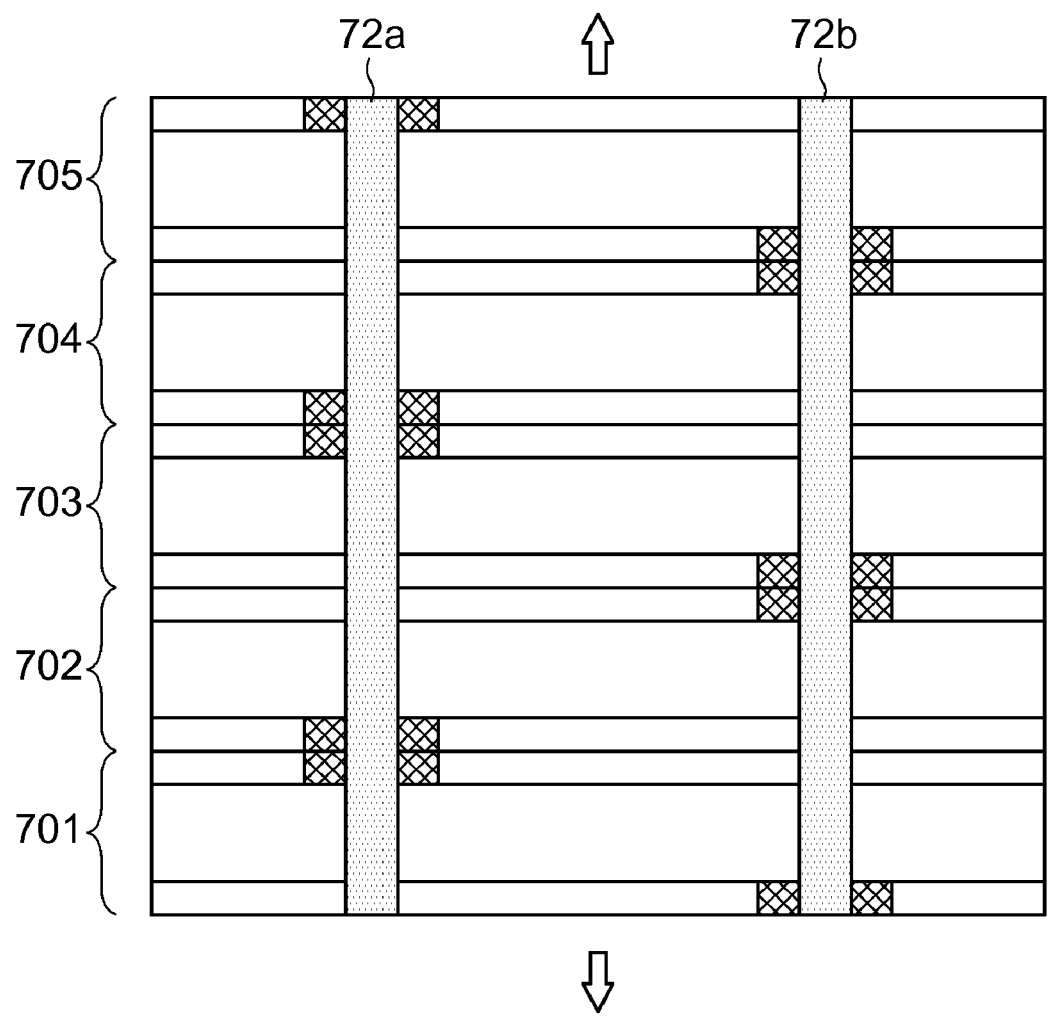

Later, as shown in FIG. 8H, the conductive materials 72a and 72b are filled in the first channel $R_H$ and the second channel $L_H$ respectively for forming a stacked-type piezoelectric device 70. The first channel $R_H$ and the second channel $L_H$ with the conductive materials 72a and 72b vertically penetrate the piezoelectric unit structures 701~705 respectively. The conductive materials 72a and 72b may be conductive adhesive (such as silver paste) or tin/lead solder.

What is worth mentioning is that when the conductive materials are directly filled in the first and second contact holes 65a and 65b of the piezoelectric unit structures in FIG. 8F, a single-layer piezoelectric device is formed accordingly.

When in use, the stacked-type piezoelectric device 70 in FIG. 8H has larger deformation or generates greater electric current. Although the second embodiment does not have the first and second insulation sidewalls 37a and 37b of the first embodiment (ex. FIG. 4H), each insulating portion is used for isolating the conductive layer from the conductive material in one of the adjacent contact hole. Therefore, effective deformation occurs along the vertical direction under the action of electric field.

What is worth mentioning is that although the conductive layers are formed on the upper and lower surfaces of each piezoelectric unit structure in the stacked-type piezoelectric device 70 in FIG. 8H, the two adjacent conductive layers between the stacked piezoelectric layers in FIG. 8H can be considered to be a single layer. Therefore, the second embodiment is encompassed by the field of the technical features in FIG. 3A of the present disclosure.

Third Embodiment

In the first and second embodiments, the conductive layers are formed on both the upper and lower surfaces of each piezoelectric layer. However, in the third embodiment, the conductive layer is formed on only one surface of the piezoelectric layer. Next, the insulating portion is formed on the conductive layer. Then, stacking, drilling and conductive material filling steps are performed for conducting electricity in order to form the stacked-type piezoelectric device.

Figure 9A:
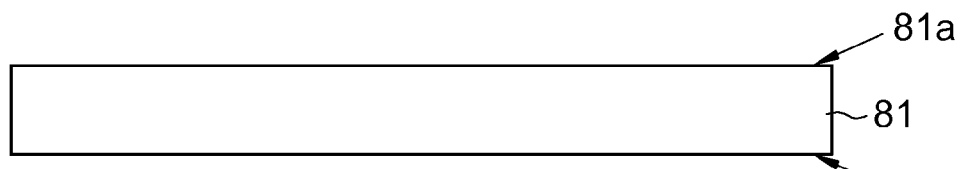
FIG. 9A~FIG. 9G show the flow of a method for manufacturing the stacked-type piezoelectric device according to the third embodiment of the present disclosure.
Figure 9B:
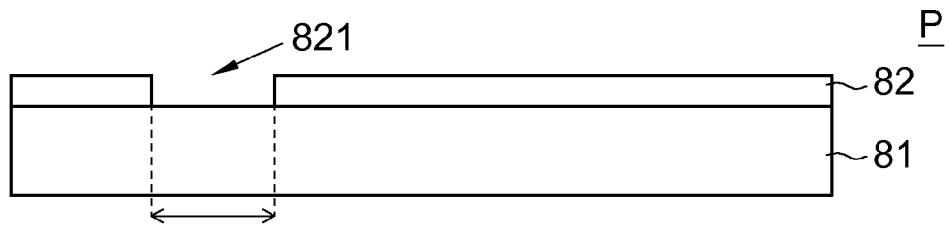

Please refer to FIG. 9A~FIG. 9G, which show the flow of a method for manufacturing the stacked-type piezoelectric device according to the third embodiment of the present disclosure. As shown in FIG. 9A, a piezoelectric layer 81 is provided first. The piezoelectric layer 81 has an upper surface 81a and a lower surface 81b. Then, a conductive layer 82 (to be the electrode layer) is formed on one of the surfaces of the piezoelectric layer 81, such as the upper surface 81a in FIG. 9B, and an opening 821 is formed on the conductive layer 82 adjacent to one side, such as the left side (or the right side). The opening 821 exposes the upper surface 81a of the piezoelectric layer 81 under the opening 821. There is no limitation on the shape of the opening 821. The opening 821 can be circular, elliptical, rectangular, or any other shape. In the present embodiment, the opening is circular as an example, and the diameter of the opening 821 is $L_6$.

Figure 9C:
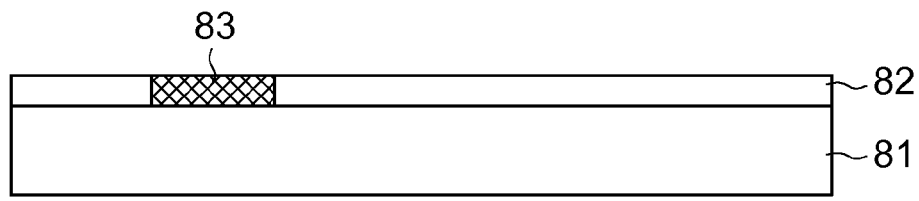

Next, as shown in FIG. 9C, the insulating material 83 is formed in the opening 821. After the insulating material 83 is filled in the opening 821, the surface of the insulating material 83 is aligned with the surface of the conductive layer 82. The insulating material 83 is for example a non-conductive adhesive, such as epoxy or another non-conductive material. When in practical use, the insulating material 83 can be filled in the opening 821 by many different methods, such as high temperature coating (for example, the temperature is greater than 700° C.). However, the present disclosure is not limited thereto. An insulating piezoelectric body P is formed by following the steps shown in FIG. 9A~FIG. 9C.

Figure 9D:
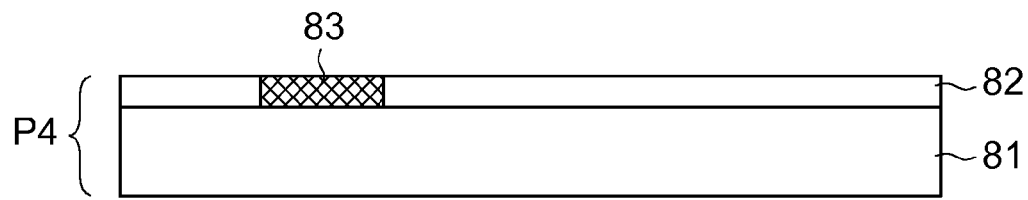
Figure 9D:
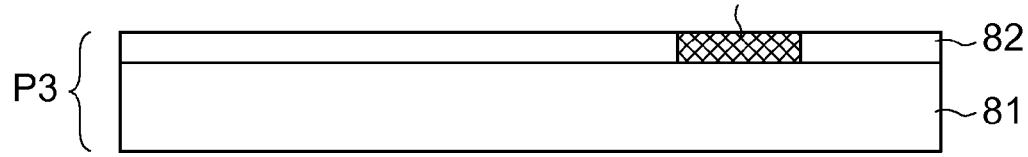
Figure 9D:
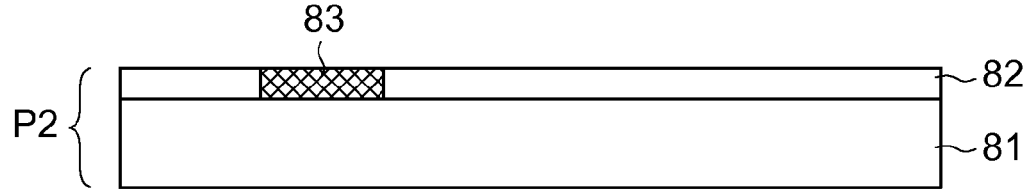
Figure 9D:
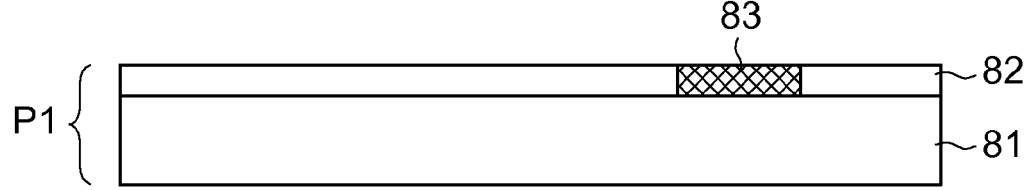

Then, as shown in FIG. 9D, several piezoelectric bodies P as shown in FIG. 9C are stacked vertically. When stacked in a staggered manner, one insulating piezoelectric body P is laterally rotate 180° and then stacked on another piezoelectric body P for forming a stacked-type assembly. Take FIG. 9D for example. The insulating material 83 of two adjacent insulating piezoelectric bodies, such as P1 and P2, are respectively formed on the right half and left half of the conductive layers 82 respectively. Along the vertical direction, the location of the insulating material 83 of the insulating piezoelectric body P4 is corresponding to the location of the insulating material 83 of the insulating piezoelectric body P2. The location of the insulating material 83 of the piezoelectric body P3 is corresponding to the location of the insulating material 83 of the piezoelectric body P1.

Figure 9E:
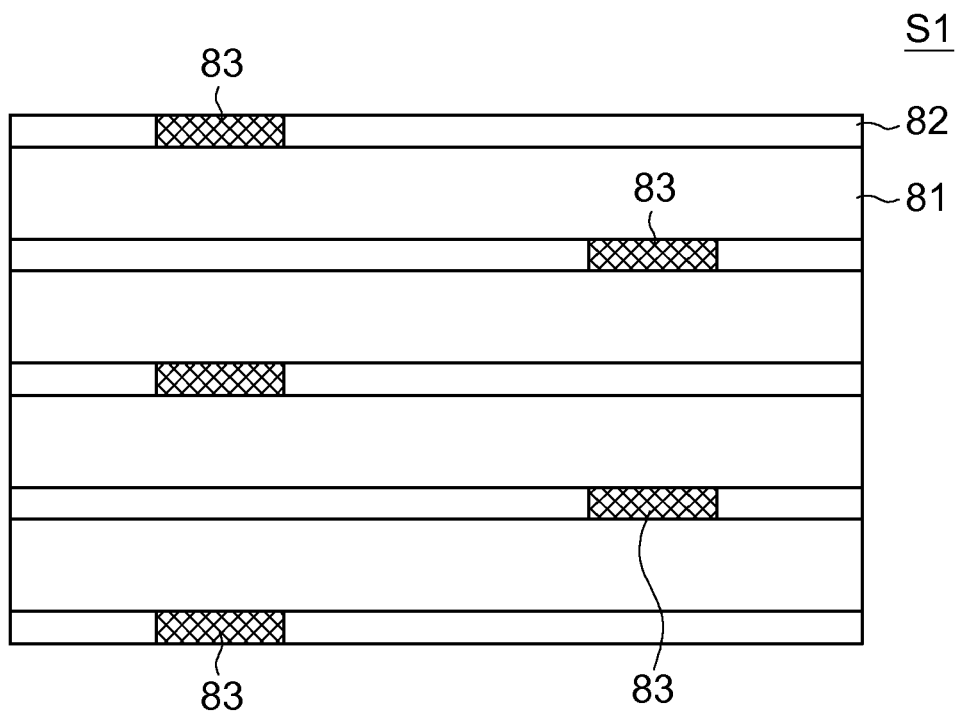

Then, as shown in FIG. 9E, hot-pressing sintering is performed on the stacked insulating piezoelectric bodies P1~P4 for forming a stacked-type assembly $S_1$.

Figure 9F:
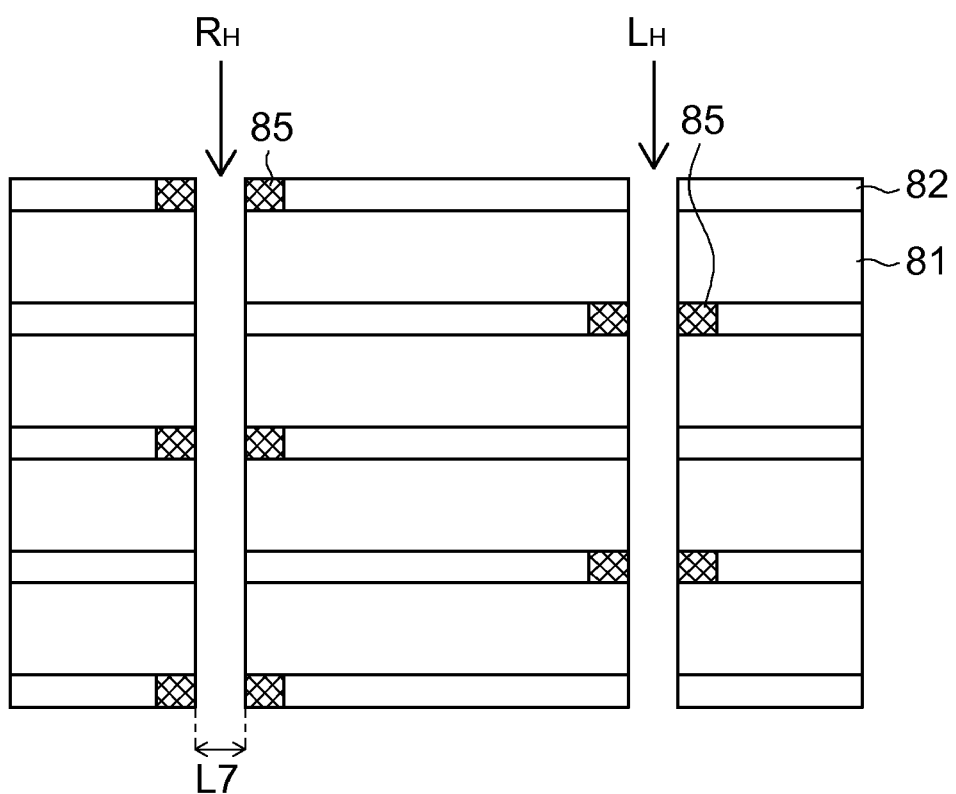

Thereon, portions of the stacked-type assembly $S_1$ which correspond to the insulating material 83 is drilled to form the first channel $R_H$ and the second channel $L_H$, as shown in FIG. 9F. There is no limitation on the shape of the channel formed by drilling. In the present embodiment, the channel is circular, and the diameter is $L_7$ as an example. Therefore, after the drilling step, the insulating portions 85 are formed on the conductive layers 82 of the insulating piezoelectric bodies P1~P4.

Figure 9G:
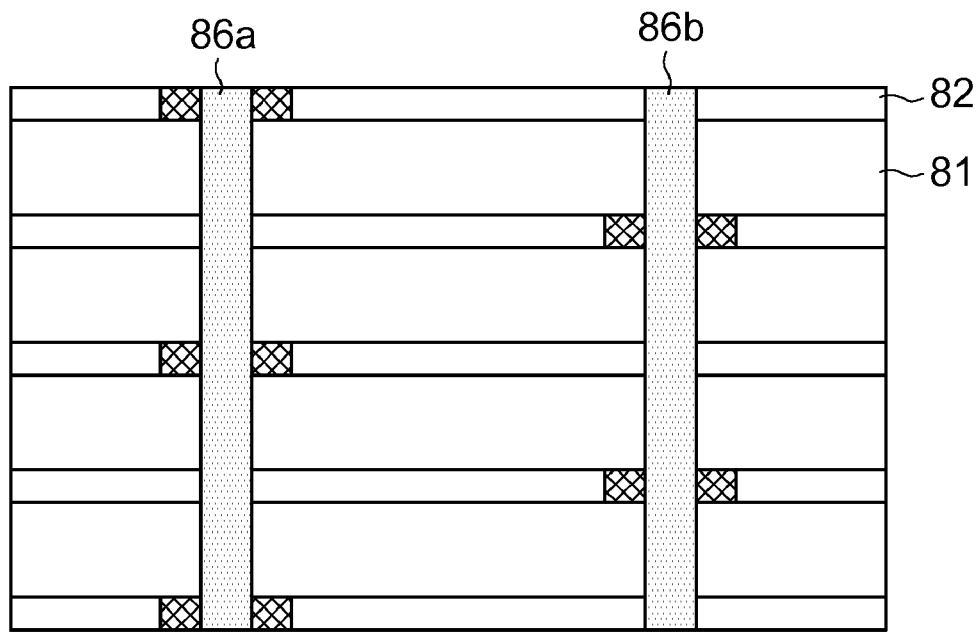

Later, as shown in FIG. 9G, the conductive materials 86a and 86b are filled in the first channel $R_H$ and the second channel $L_H$, for forming a stacked-type piezoelectric device. The first channel $R_H$ and the second channel $L_H$ with the conductive materials 86a and 86b respectively penetrate the insulated piezoelectric bodies P1~P4. The conductive materials 86a and 86b are for example elastic conductive materials (such as conductive adhesive or silver paste) or tin/lead solder. The step of filling the conductive materials 86a and 86b can be performed by chemical-plating, electroplating, photolithography process or any other practical method. The present disclosure is not limited thereto.

Figure 10:
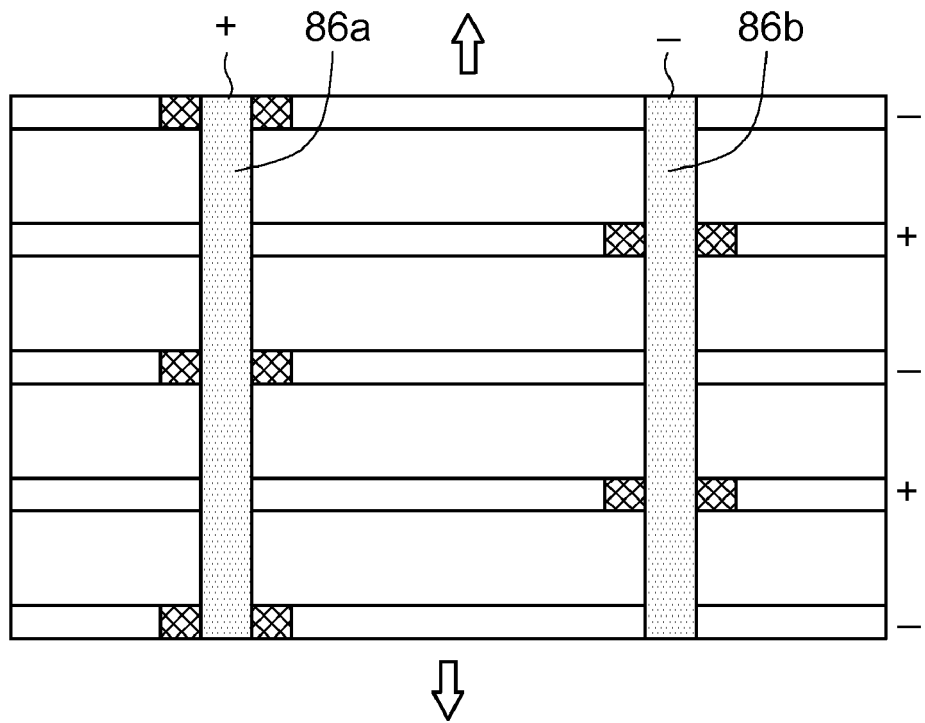
FIG. 10 illustrates the stacked-type piezoelectric device according to the third embodiment of the present disclosure.

FIG. 10 illustrates the stacked-type piezoelectric device according to the third embodiment of the present disclosure. When the stacked-type piezoelectric device manufactured by the steps in FIG. 9A~FIG. 9G is in practical use, the conductive material 86a in the first channel $R_H$ and the conductive material 86b in the second channel $L_H$ are respectively connected to the positive and negative electrodes of an external power source. The insulating portion 85 is used for isolating the conductive layers from the conductive material (86a or 86b) in one of the adjacent channel. FIG. 10 shows the polarity of each conductive layer. When a constant voltage is applied to the stacked-type piezoelectric device in FIG. 10 in practical use, the piezoelectric layers 81 between the conductive layers 82 deform and expand along the directions indicated by the arrows.

Furthermore, the stacked-type piezoelectric device manufactured according to the third embodiment of the present disclosure is encompassed by the field of the technical features in FIG. 3A of the present disclosure.

Fourth Embodiment

The method of the fourth embodiment is slightly different from that of the third embodiment, but the structures of the stacked-type piezoelectric devices are the same which are encompassed by the field of the technical features in FIG. 3A of the present disclosure. In the fourth embodiment, the stacked piezoelectric bodies are drilled, filled with the insulating material, drilled again and filled with the conductive material for conducting electricity in order to form a stacked-type piezoelectric device. Furthermore, the components of the fourth embodiment which are the same as those of the third embodiment use the same reference numbers for easier illustration.

Figure 11A:
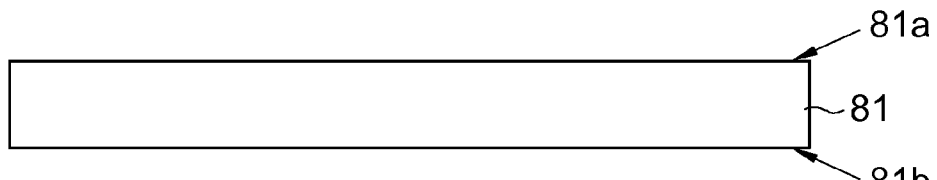
FIG. 11A~FIG. 11H show the flow of the method for manufacturing a stacked-type piezoelectric device according to the fourth embodiment of the present disclosure.

Please refer to FIG. 11A~FIG. 11H, which show the flow of the method for manufacturing a stacked-type piezoelectric device according to the fourth embodiment of the present disclosure. First, as shown in FIG. 11A, a piezoelectric layer 81 is provided. The piezoelectric layer 81 has an upper surface 81a and a lower surface 81b. Next, a conductive layer 82 (to be the electrode layer) is formed on one surface of the piezoelectric layer 81, such as the upper surface 81a in FIG. 11B, and an opening 821 is formed on the conductive layer 82 adjacent to one side, such as the left side (or the right side), of the piezoelectric layer 81. The opening 821 can be circular, elliptical, rectangular, or any other shape. In the present embodiment, the opening is circular as an example, and the diameter of the opening 821 is $L_6$.

Figure 11B:
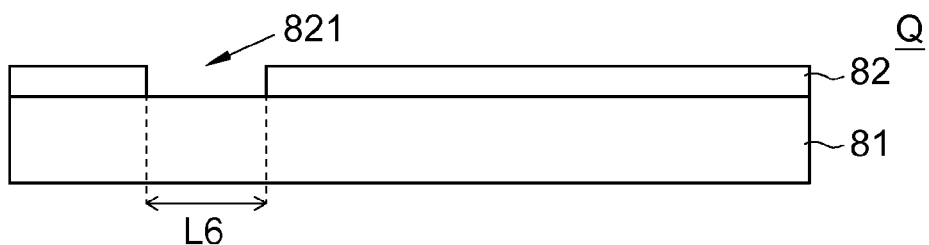
Figure 11C:
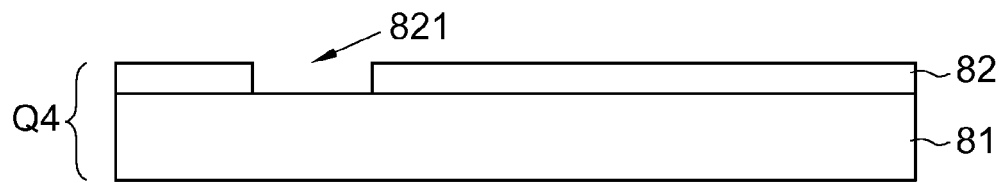
Figure 11C:
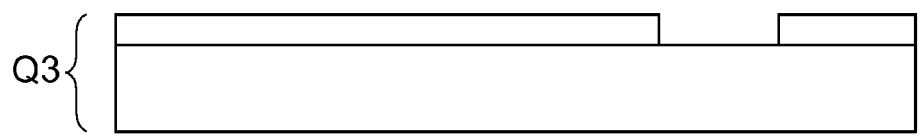
Figure 11C:
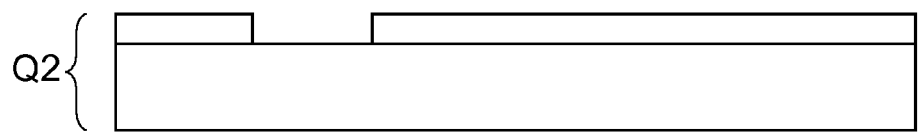
Figure 11C:
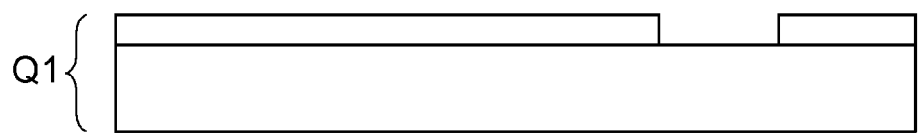

Next, as shown in FIG. 11C, several piezoelectric bodies Q as shown in FIG. 11B are stacked vertically. When stacked in a staggered manner, one insulating piezoelectric body Q is laterally rotate 180° and then stacked on another piezoelectric body Q for forming a stacked-type assembly. Take FIG. 11C for example. The openings 821 of two adjacent piezoelectric bodies, such as Q1 and Q2, are respectively formed on the right half and left half of the conductive layer 82. Along the vertical direction, the location of the opening 821 of the piezoelectric body Q4 is corresponding to the location of the opening 821 of the piezoelectric body Q2. The location of the opening 821 of the piezoelectric body Q3 is corresponding to the location of the opening 821 of the piezoelectric body Q1.

Figure 11D:
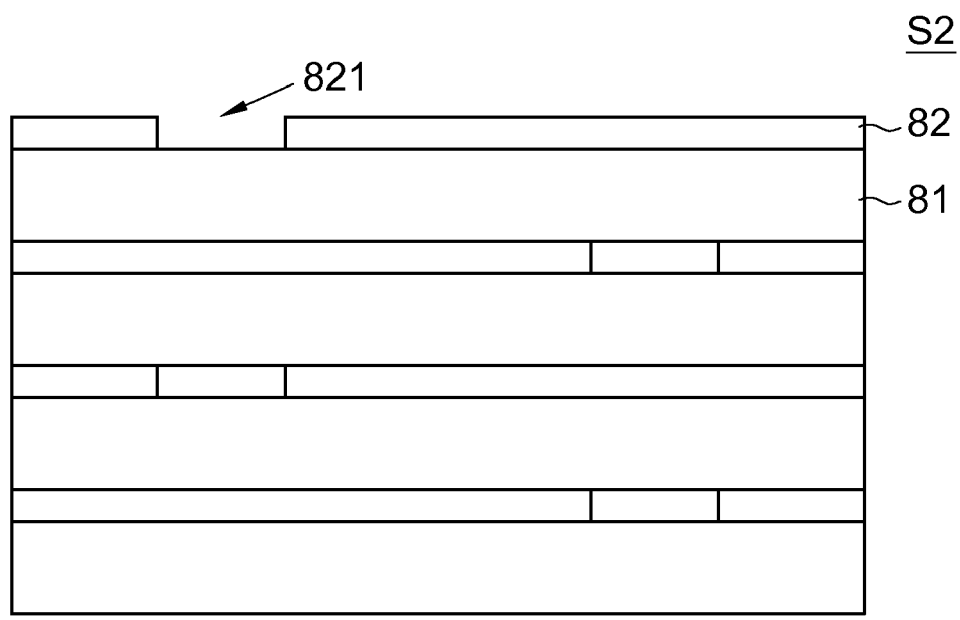

Subsequently, as shown in FIG. 11D, hot-pressing sintering is performed on the stacked piezoelectric bodies Q1~Q4 for forming a stacked-type assembly $S_2$.

Figure 11E:
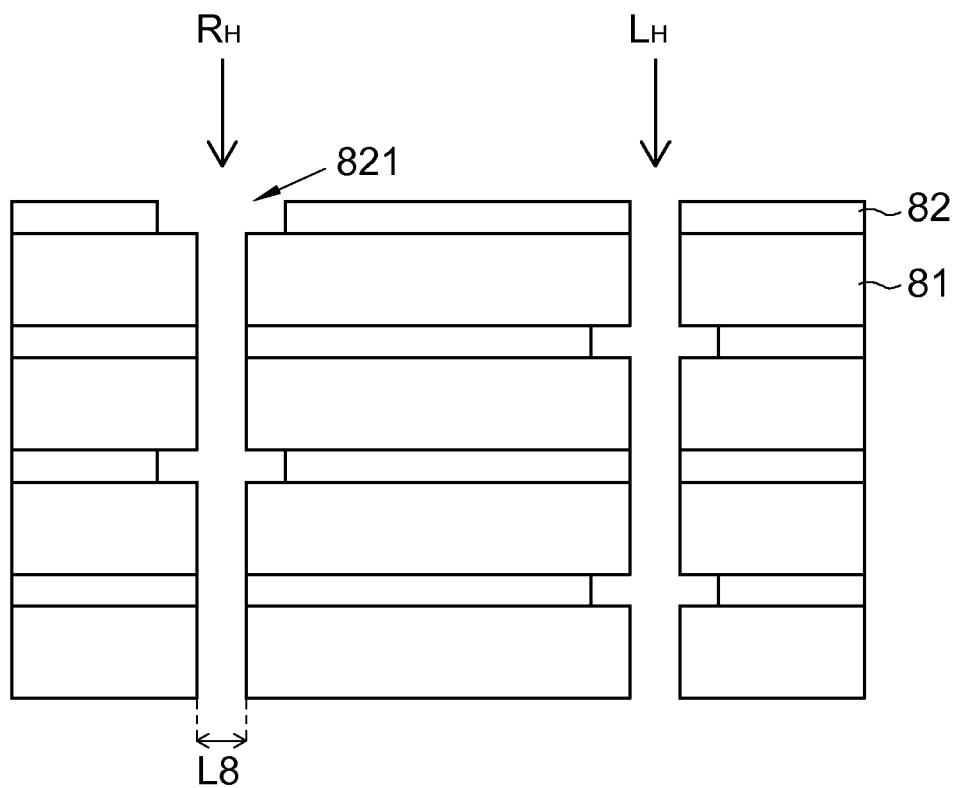

Thereon, a portion of the stacked-type assembly $S_2$ which corresponds to the opening 821 is drilled to form the first channel $R_H$ and the second channel $L_H$, as shown in FIG. 11E. There is no limitation on the shape of the channel formed by drilling. In the present embodiment, the channel is circular, and the diameter is $L_8$ as an example. The diameter $L_8$ of the channel is less than the diameter $L_6$ of the opening 821.

Figure 11F:
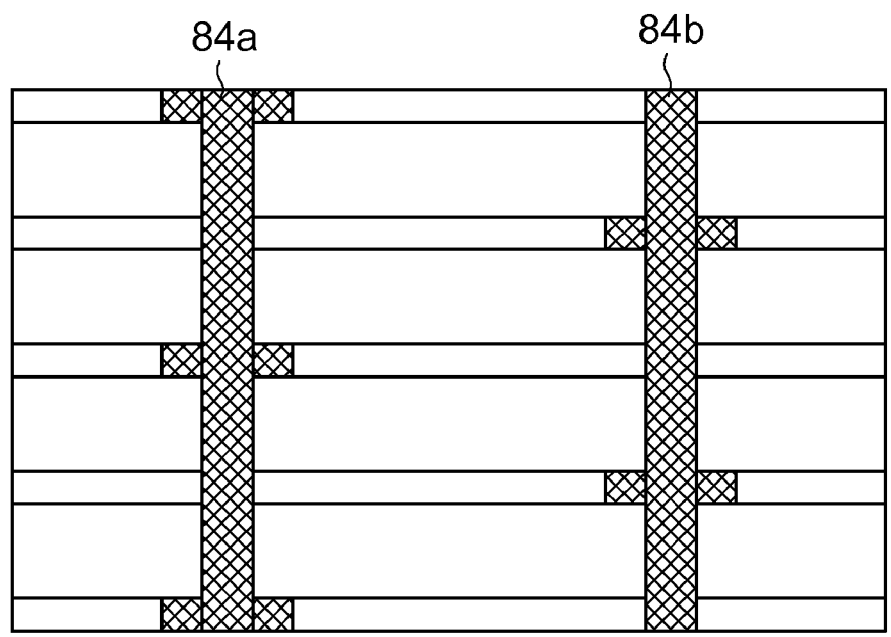

Later, as shown in FIG. 11F, the insulating materials 84a and 84b are filled in the first channel $R_H$, the second channel $L_H$ and the opening 821. After the filling step, the surfaces of the insulating materials 84a and 84b are aligned with the surface of the conductive layer 82. For example, the insulating materials 84a and 84b may be non-conductive adhesive, such as epoxy or another non-conductive material.

Figure 11G:
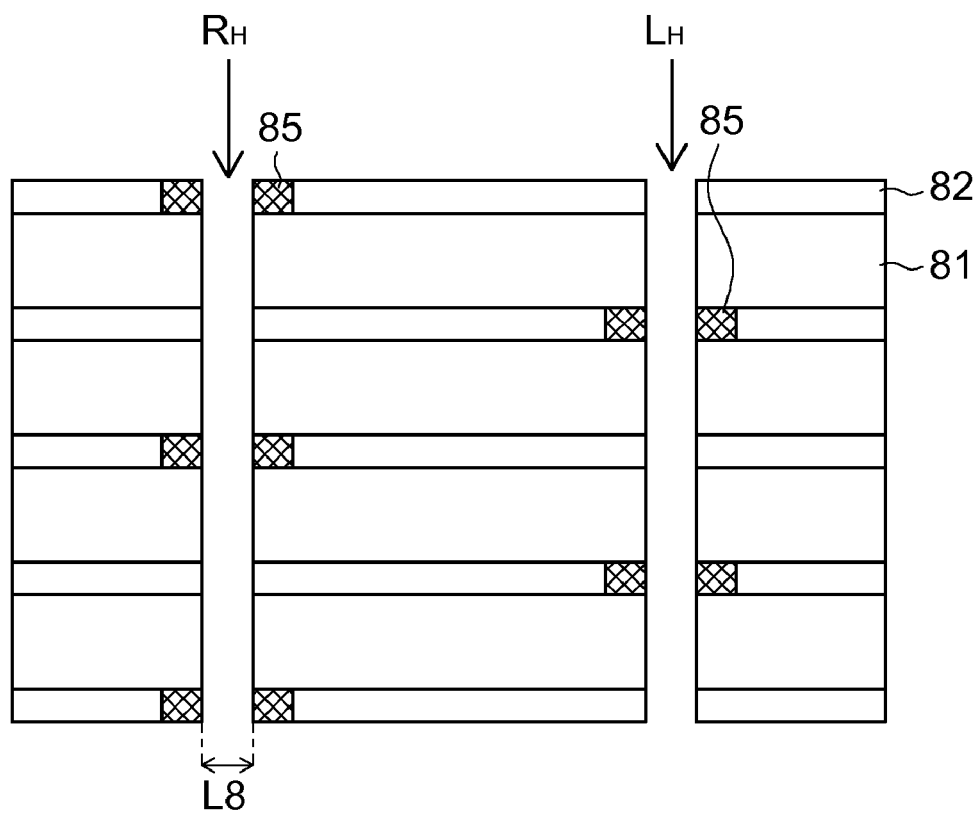

Next, as shown in FIG. 11G, the first channel $R_H$ and the second channel $L_H$ are drilled again for removing the insulating materials in the first channel $R_H$ and the second channel $L_H$. The insulating portions 85 are formed in the conductive layers 82 of the piezoelectric bodies Q1~Q4. The diameter of the drilled holes is $L_8$.

Figure 11H:
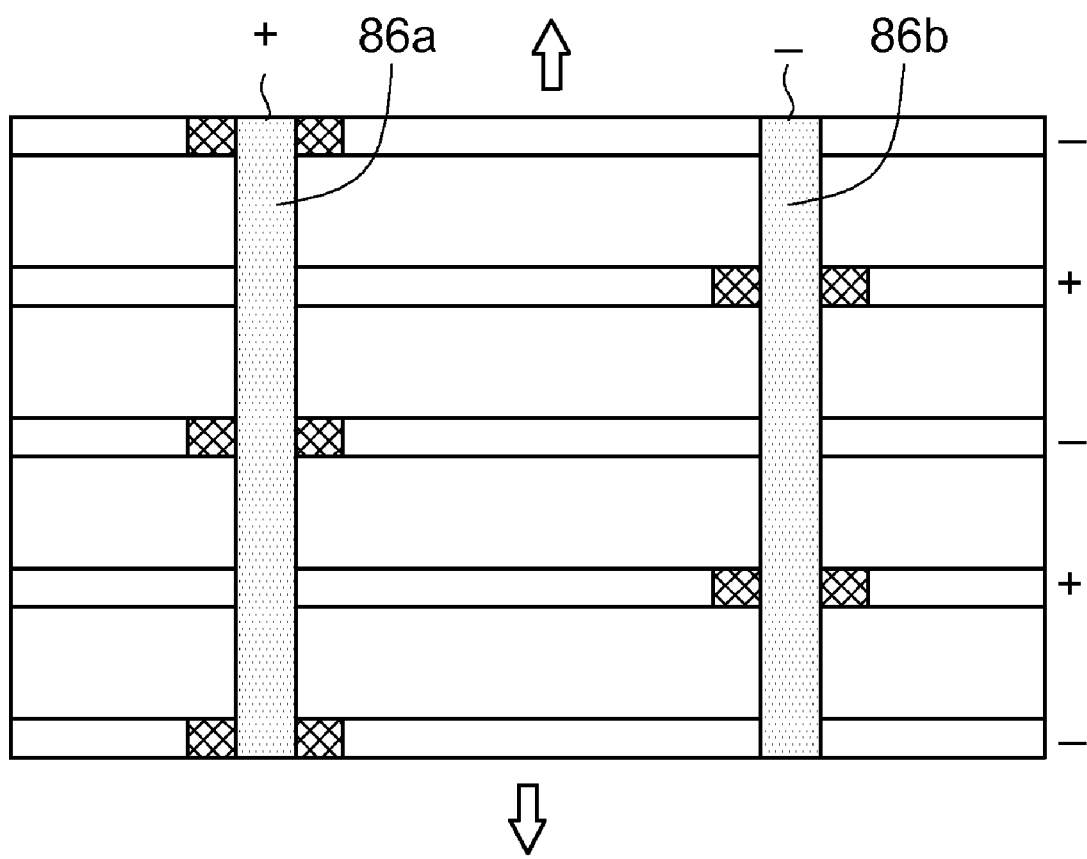

Later, as shown in FIG. 11H, the conductive materials 86a and 86b are respectively filled in the first channel $R_H$ and the second channel $L_H$, for forming a stacked-type piezoelectric device. The first channel $R_H$ and the second channel $L_H$ with the conductive materials 86a and 86b vertically penetrate the piezoelectric bodies Q1~Q4 respectively. The conductive materials 86a and 86b are for example elastic conductive materials (such as conductive adhesive or silver paste) or tin/lead solder. The step of filling the conductive materials 86a and 86b can be performed by chemical-plating, electroplating, photolithography process or any other practical method. The present disclosure is not limited thereto.

When the stacked-type piezoelectric device in FIG. 11H is in practical use, the conductive materials 86a filled in the first channel $R_H$ and the conductive material 86b filled in the second channel $L_H$ are respectively connected to the positive and negative electrodes of an external power source. The insulating portions 85 are used for isolating the conductive layers from the conductive material (86a or 86b) in the adjacent channel. When a constant voltage is applied to the stacked-type piezoelectric device in practical use, the piezoelectric layers 81 between the conductive layers 82 deform and expand along the directions indicated by the arrows.

In the stacked-type piezoelectric devices according to the first to fourth embodiments of the present disclosure, the piezoelectric material is drilled and then filled with the conductive material to form the piezoelectric device with staggered positive and negative electrodes. Whether the device according to the embodiments has the structure in FIG. 3A or FIG. 3B, there is no need to use the frame which is used conventionally for fastening the piezo-actuator. As a result, the planar driving material expands and deforms evenly, and the piezoelectric layer does not crack easily due to excessive tensile stress. Furthermore, the size of the device is reduced greatly, and the appearance is simplified. Therefore, a compact actuator can be manufactured accordingly.

The disclosure is directed to a stacked-type piezoelectric device and a manufacturing method thereof. When in practical use, the manufactured piezoelectric materials of the piezoelectric device deforms evenly in a plane, which reduces the possibility of damage and fracture. Also, the appearance of the device is simplified, and the volume is decreased greatly.

While the disclosure has been described by way of example and in terms of a exemplary embodiment, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A piezoelectric unit structure, comprising:
    a piezoelectric layer, having an upper surface and a lower surface;
    a first conductive layer and a second conductive layer, respectively located on the upper and lower surfaces of the piezoelectric layer;
    a first contact hole, penetrating the piezoelectric layer;
    a second contact hole, penetrating the piezoelectric layer; and
    at least an insulating portion formed in one of the first and second conductive layers and surrounding one of the first and second contact holes, for isolating the contact hole from the conductive layer in which the insulating portion is formed, wherein the material of the insulating portion comprises epoxy.

2. The piezoelectric unit structure according to claim 1, wherein the first contact hole penetrates one side of the first conductive layer, the piezoelectric layer and the second conductive layer, and the second contact hole penetrates the other side of the first conductive layer, the piezoelectric layer and the second conductive layer.

3. The piezoelectric unit structure according to claim 2, wherein the first contact hole and the second contact hole are perpendicular to the first conductive layer, the piezoelectric layer and the second conductive layer respectively.

4. The piezoelectric unit structure according to claim 2 further comprising another insulating portion, wherein the two insulating portions are respectively formed on the first conductive layer and the second conductive layer on the upper and lower surfaces of the piezoelectric layers, and the two insulating portions respectively surround the outer rims of the first and second contact holes of the conductive layers.

5. The piezoelectric unit structure according to claim 2, wherein the first and second contact holes are filled with a conductive material.

6. The piezoelectric unit structure according to claim 5 further comprising an insulation sidewall connected to the insulating portion and located between the piezoelectric layer and the conductive material, for electrically isolating the piezoelectric layer and the conductive material in the contact hole.

7. The piezoelectric unit structure according to claim 5 comprising:
    a first insulating portion, formed in the first conductive layer and at the outer rim of the first contact hole, to electrically isolate the first conductive layer from the conductive material in the first contact hole; and
    a second insulating portion, formed in the second conductive layer and at the outer rim of the second contact hole, to electrically isolate the second conductive layer from the conductive material in the second contact hole.

8. The piezoelectric unit structure according to claim 7 further comprising:
    a first insulation sidewall, connected to the first insulating portion and electrically isolating the conductive material in the first contact hole from the piezoelectric layer; and
    a second insulation sidewall, connected to the second insulating portion and electrically isolating the conductive material in the second contact hole from the piezoelectric layer.

9. The piezoelectric unit structure according to claim 8, wherein an end of the first insulation sidewall is aligned with the lower surface of the piezoelectric layer, and an end of the second insulation sidewall is aligned with the upper surface of the piezoelectric layer.

10. A multi-layer stacked-type piezoelectric device, comprising:
    a plurality of piezoelectric units stacked together, each of the piezoelectric units comprising:
        a piezoelectric layer, having an upper surface and a lower surface;
        a first conductive layer and a second conductive layer, respectively located on the upper and lower surfaces of the piezoelectric layer;
        a first contact hole and a second contact hole, respectively penetrating two lateral sides of the first conductive layer, the piezoelectric layer and the second conductive layer, wherein the first contact hole and the second contact hole are filled with a conductive material; and
        a first insulating portion and a second insulating portion, respectively formed on the first and second conductive layers on the upper and lower surfaces of the piezoelectric layer and located at the outer rims of the first and second contact holes, for electrically isolating the conductive layer in which the insulating portions are formed from the conductive material in the contact hole, wherein the materials of the first and second insulating portions comprise epoxy;
    wherein in the multi-layer stacked-type piezoelectric device, the first or second insulating portion of each piezoelectric unit corresponds to and contacts the first or second insulating portion of another piezoelectric unit.

11. The multi-layer stacked-type piezoelectric device according to claim 10, wherein each piezoelectric unit further comprises:
    a first insulation sidewall, connected to the first insulating portion and electrically isolating the conductive material in the first contact hole from the piezoelectric layer; and
    a second insulation sidewall, connected to the second insulating portion and electrically isolating the conductive material in the second contact hole from the piezoelectric layer.

12. The multi-layer stacked-type piezoelectric device according to claim 10, wherein in each piezoelectric unit, an end of the first insulation sidewall is aligned with the lower surface of the piezoelectric layer, and an end of the second insulation sidewall is aligned with the upper surface of the piezoelectric layer.

13. The multi-layer stacked-type piezoelectric device according to claim 10, wherein the conductive material is a conductive adhesive.

14. The multi-layer stacked-type piezoelectric device according to claim 10, wherein the conductive material is silver paste.

15. A stacked-type piezoelectric device, comprising:
- a plurality of piezoelectric layers;
- a plurality of conductive layers, formed between the piezoelectric layers;
- a first contact hole and a second contact hole, respectively penetrating the piezoelectric layers and the conductive layers, wherein the first and second contact holes are filled with a conductive material; and
- a plurality of insulating portions, formed in the conductive layers correspondingly, and two adjacent insulating portions respectively located at the outer rims of the first contact hole and the second contact hole, for electrically isolating the conductive layer in which the insulating portion is formed from the conductive material in the contact hole, wherein the material of the insulating portions comprises epoxy.

16. The multi-layer stacked-type piezoelectric device according to claim 15 further comprising n piezoelectric layers and (n+1) conductive layers, wherein n is a positive integer not less than 2, the insulating portions on the odd-numbered conductive layers are corresponding to the outer rim of the first contact hole, and the insulating portions on the even-numbered conductive layers are corresponding to the outer rim of the second contact hole.

17. The multi-layer stacked-type piezoelectric device according to claim 15 further comprising: a plurality of insulation sidewalls disposed between the piezoelectric layers and the first and second contact holes, for electrically isolating the piezoelectric layer from the conductive material in the contact hole in which the insulation sidewalls are formed.

18. The multi-layer stacked-type piezoelectric device according to claim 15, wherein the insulation sidewalls are connected to the adjacent insulating portions respectively.

19. The multi-layer stacked-type piezoelectric device according to claim 15, wherein the conductive material is a conductive adhesive.

20. The multi-layer stacked-type piezoelectric device according to claim 19, wherein the conductive material is silver paste.

* * * * *